United States Patent
Higaki et al.

(10) Patent No.: US 8,247,141 B2
(45) Date of Patent: Aug. 21, 2012

(54) METHOD OF GENERATING RETICLE DATA, MEMORY MEDIUM STORING PROGRAM FOR GENERATING RETICLE DATA AND METHOD OF PRODUCING RETICLE

(75) Inventors: Yoshinari Higaki, Utsunomiya (JP); Miyoko Kawashima, Haga-gun (JP)

(73) Assignee: Canon Kabushiki Kaisha (JP)

( * ) Notice: Subject to any disclaimer, the term of this patent is extended or adjusted under 35 U.S.C. 154(b) by 177 days.

(21) Appl. No.: 12/685,275

(22) Filed: Jan. 11, 2010

(65) Prior Publication Data
US 2010/0183959 A1 Jul. 22, 2010

(30) Foreign Application Priority Data

Jan. 19, 2009 (JP) .................................. 2009-009361
Dec. 22, 2009 (JP) .................................. 2009-290867

(51) Int. Cl.
*G03F 1/38* (2012.01)
*G06F 17/50* (2006.01)

(52) U.S. Cl. ............................................ 430/5; 716/53
(58) Field of Classification Search .............. 430/5, 394; 716/50–55; 382/141
See application file for complete search history.

(56) References Cited

U.S. PATENT DOCUMENTS

| | | | |
|---|---|---|---|
| 6,563,566 B2 | 5/2003 | Rosenbluth et al. | |
| 6,670,080 B2 | 12/2003 | Sugita et al. | |
| 6,807,654 B2 | 10/2004 | Akutagawa et al. | |
| 6,968,531 B2 | 11/2005 | Iiduka et al. | |
| 7,506,299 B2 | 3/2009 | Socha et al. | |
| 7,512,928 B2 | 3/2009 | Jessen et al. | |
| 7,523,438 B2 | 4/2009 | Hsu et al. | |
| 7,550,235 B2* | 6/2009 | Shi et al. ........................ | 430/5 |
| 7,594,199 B2 | 9/2009 | Socha et al. | |
| 7,608,468 B1 | 10/2009 | Ghinovker et al. | |
| 7,700,247 B2 | 4/2010 | Ausschnitt | |
| 7,712,070 B2 | 5/2010 | Moon | |

(Continued)

FOREIGN PATENT DOCUMENTS

JP 2004-221594 A 8/2004

(Continued)

OTHER PUBLICATIONS

"Computer Readable Storage Medium Storing Program for Generating Reticle Data, and Method of Generating Reticle Data", Miyoko Kawashima, Specification and Drawings of unpublished related co-pending U.S. Appl. No. 12/684,675, filed Jan. 8, 2010 pp. 1-89.

(Continued)

*Primary Examiner* — Stephen Rosasco
(74) *Attorney, Agent, or Firm* — Rossi, Kimms & McDowell LLP

(57) ABSTRACT

A method of generating reticle data for producing a reticle, a pattern of the reticle including a main pattern, a first auxiliary pattern, and a second auxiliary pattern, the first auxiliary pattern and the second auxiliary pattern being patterns not to resolve, light having passed through the first auxiliary pattern and light having passed through the main pattern being in phase, and light having passed through the second auxiliary pattern and light having passed through the main pattern having a phase difference of 180° from each other, the method comprising the step of deleting either of the first auxiliary pattern and the second auxiliary pattern or deforming at least either of the first auxiliary pattern and the second auxiliary pattern when the first auxiliary pattern and the second auxiliary pattern overlap each other.

9 Claims, 27 Drawing Sheets

U.S. PATENT DOCUMENTS

| | | |
|---|---|---|
| 7,723,230 B2 | 5/2010 | Setta |
| 7,725,872 B2 | 5/2010 | Hsu et al. |
| 7,781,748 B2 | 8/2010 | Platzgummer |
| 7,876,438 B2 | 1/2011 | Ghinovker et al. |
| 7,927,773 B2 | 4/2011 | Hakko |
| 8,020,135 B2 | 9/2011 | Fujimura et al. |
| 8,059,262 B2 | 11/2011 | Yamazoe |
| 8,060,842 B2 | 11/2011 | Socha |
| 2008/0052334 A1 | 2/2008 | Yamazoe |
| 2009/0074287 A1 | 3/2009 | Kawashima |
| 2009/0077527 A1 | 3/2009 | Gergov et al. |
| 2010/0009272 A1 | 1/2010 | Kawashima |
| 2010/0178621 A1 | 7/2010 | Hakko et al. |
| 2010/0183959 A1 | 7/2010 | Higaki et al. |
| 2010/0186000 A1 | 7/2010 | Sezginer et al. |
| 2011/0032499 A1 | 2/2011 | Kawashima |
| 2011/0107280 A1 | 5/2011 | Liu et al. |
| 2011/0122394 A1 | 5/2011 | Kawashima et al. |

FOREIGN PATENT DOCUMENTS

| | | |
|---|---|---|
| JP | 2005-183981 A | 7/2005 |
| JP | 2008-040470 A | 2/2008 |

OTHER PUBLICATIONS

Office Action issued Dec. 16, 2011 for related U.S. U.S. 2010/0180252.

* cited by examiner

AUXILIARY PATTERN PLACEMENT

AUXILIARY PATTERN PLACEMENT

AUXILIARY PATTERN PLACEMENT

F I G. 5A
TARGET PATTERN IN FIRST AND SECOND EMBODIMENTS
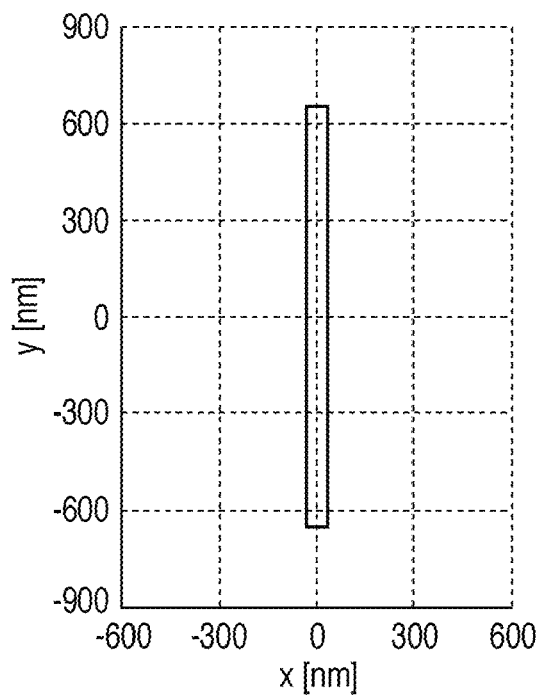
F I G. 5B
EFFECTIVE LIGHT SOURCE 1
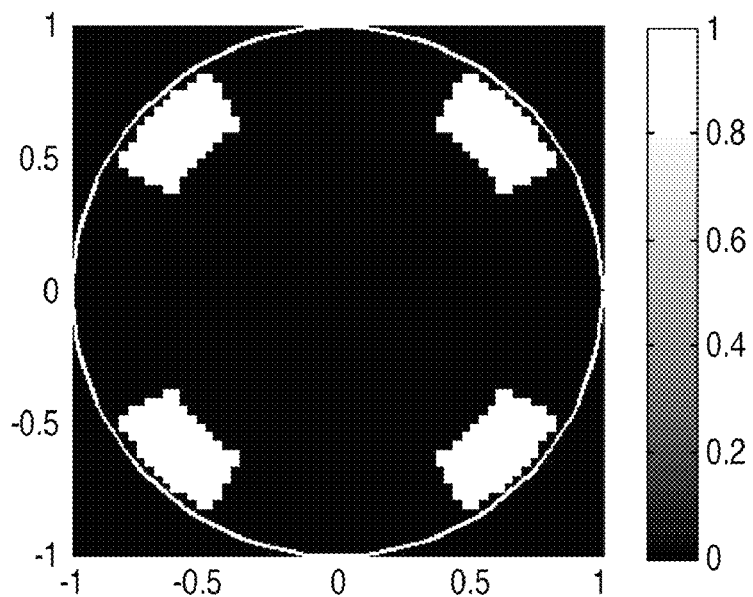

APPROXIMATED AERIAL IMAGE BEFORE OPC
(LIGHT SOURCE 1)

APPROXIMATED AERIAL IMAGE AFTER OPC
(LIGHT SOURCE 1)

PATTERN BEFORE OPC

PATTERN AFTER OPC

TWO-DIMENSIONAL SECTIONAL IMAGE BEFORE OPC

TWO-DIMENSIONAL SECTIONAL IMAGE AFTER OPC type 1 type 2 type 3

POSITION 2
POSITION 1

LINE WIDTH AT POSITION 20 nm INSIDE LINE END

NILS OF LINE END IN LONGITUDINAL DIRECTION type 1 type 2

TWO-DIMENSIONAL IMAGE OF type 1

POSITION 2
POSITION 1

TARGET PATTERNS IN THIRD EMBODIMENT

APPROXIMATED AERIAL IMAGE IN THIRD EMBODIMENT

APPROXIMATED AERIAL IMAGE WHEN PATTERN DENSITY IS CHANGED type 1 type 2

TWO-DIMENSIONAL IMAGE OF type 2

POSITION 2
POSITION 1

TARGET PATTERNS IN FOURTH EMBODIMENT

APPROXIMATED AERIAL IMAGE IN FOURTH EMBODIMENT type 1 type 2

TWO-DIMENSIONAL IMAGE OF type 1

POSITION 1
POSITION 2

TARGET PATTERN IN FIFTH EMBODIMENT

APPROXIMATED AERIAL IMAGE IN FIFTH EMBODIMENT

F I G. 29A
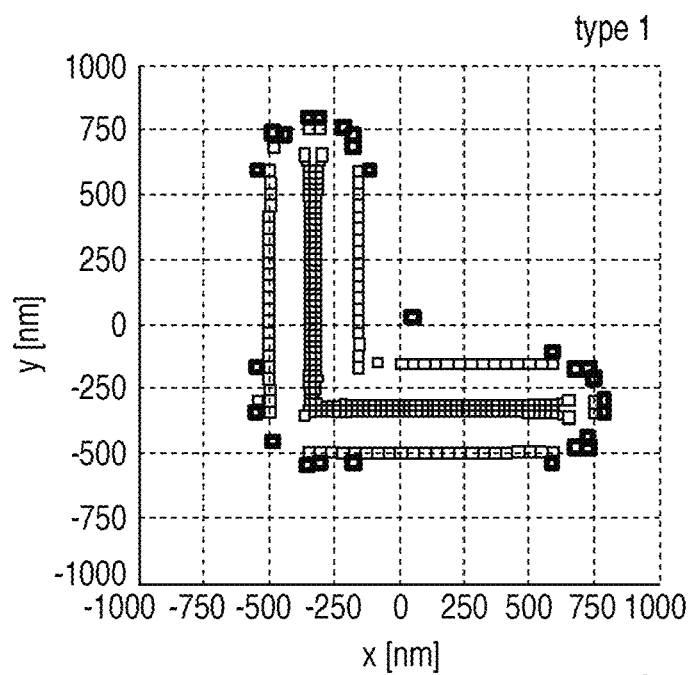
F I G. 29B
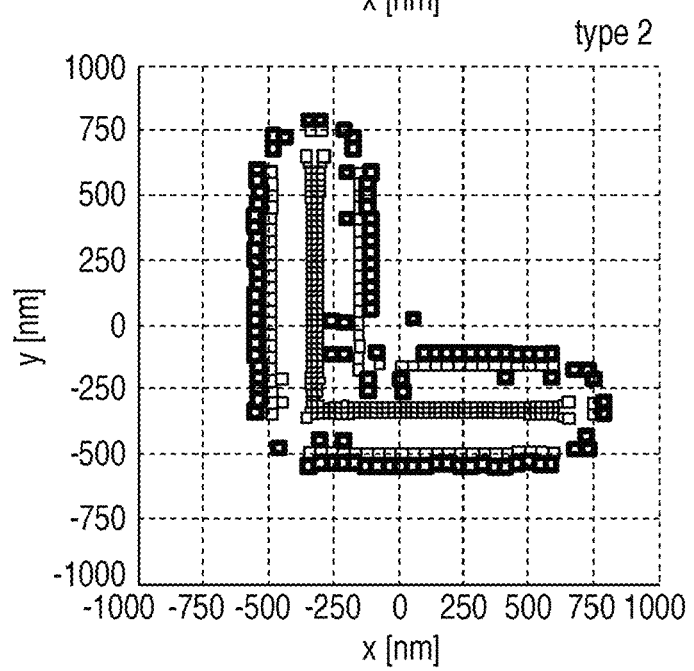
F I G. 30
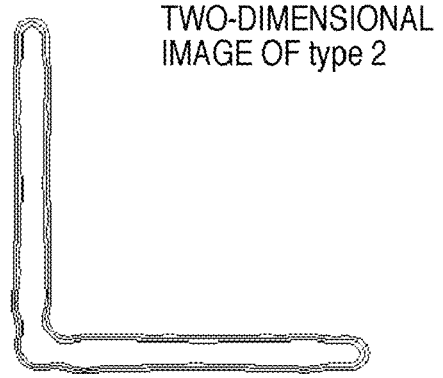

TARGET PATTERNS IN SIXTH EMBODIMENT

EFFECTIVE LIGHT SOURCE type 1 type 2

POSITION 2
POSITION 1

PRECISION AERIAL
IMAGE OF type 2

METHOD OF GENERATING RETICLE DATA, MEMORY MEDIUM STORING PROGRAM FOR GENERATING RETICLE DATA AND METHOD OF PRODUCING RETICLE

BACKGROUND OF THE INVENTION

1. Field of the Invention

The present invention relates to a method of generating reticle data, a memory medium storing a program for generating reticle data, and a method of producing a reticle.

2. Description of the Related Art

A semiconductor device is manufactured by repeating a photolithography process. The photolithography process includes an exposure process of exposing a substrate by illuminating a reticle (also called a mask or original) bearing a circuit pattern with exposure light, and projecting the circuit pattern onto a substrate (e.g., a wafer) via a projection optical system. Recent miniaturization of semiconductor devices requires formation of patterns with dimensions smaller than the wavelength of exposure light. However, the formation of such fine patterns is greatly affected by diffraction of light. The contour of a reticle pattern may not be directly formed on a substrate. The pattern may be rounded at the corner or shorten, or the shape accuracy may greatly decrease. To suppress such degradation, the shape of a reticle pattern is corrected. This correction is called optical proximity correction (OPC).

In conventional OPC, the shape of a reticle pattern is corrected by a rule base or a model base using optical simulation, by taking account of the shape of each figure of the reticle pattern and the influence of surrounding patterns.

In the model base OPC, a reticle pattern is repetitively deformed until a target pattern is obtained. As the method of deformation, various methods have been proposed. An example is a method (so-called iterative improvement) of, if critical dimension (CD) of the optical image is partially excessive, narrowing a reticle pattern by the same amount as the excess, and if CD of the optical image is partially insufficient, expanding the reticle pattern by the same amount. While the optical image is recalculated for the changed reticle pattern, a formed pattern is gradually deformed to match with a target pattern. A method using a genetic algorithm has also been proposed. A method of inserting an auxiliary pattern of a size small enough not to resolve is popular, too.

Japanese Patent Laid-Open Nos. 2004-221594 and 2005-183981 disclose methods of determining how to insert an auxiliary pattern by numerical calculation. According to this technique, an interference map is obtained by numerical calculation. A portion where patterns interfere constructively with each other on a reticle and a portion where they interfere destructively with each other are derived from the interference map. At a portion where patterns interfere constructively with each other on the interference map, an auxiliary pattern is inserted to make exposure light having passed through the aperture of a main pattern in phase with exposure light having passed through an auxiliary pattern. At a portion where patterns interfere destructively with each other on the interference map, an auxiliary pattern is inserted to make exposure light having passed through the aperture of a contact hole pattern serving as a main pattern 180° out of phase with exposure light having passed through an auxiliary pattern. Consequently, the main and auxiliary patterns interfere constructively with each other, forming a pattern almost equal to a target pattern on a substrate. The reticle surface and substrate surface have an imaging relationship, so that the interference map can be regarded as an electric field amplitude on the image plane.

Japanese Patent Laid-Open No. 2008-40470 also discloses a method of numerically obtaining information of an auxiliary pattern. A mask pattern and wafer pattern in a semiconductor exposure apparatus have a partial coherent imaging relationship. In the partial coherent imaging, an aerial image can be calculated by obtaining the coherence on the mask surface from information of an effective light source and performing Fourier integration based on the coherence and the spectral distribution (diffracted light distribution) of a mask. The "coherence" herein mentioned is the degree of interference corresponding to the distance on the mask surface. The "effective light source" is a light intensity distribution formed on the pupil of a projection optical system without any mask.

The coherence of the effective light source can be considered using a transmission cross coefficient (TCC). The TCC is defined on the pupil plane of a projection optical system, and is the portion where the effective light source, the pupil function of the projection optical system, and the complex conjugate of the pupil function of the projection optical system overlap.

According to the method disclosed in Japanese Patent Laid-Open No. 2008-40470, the TCC function is two-dimensionally expressed by fixing the pupil position, thereby obtaining an aerial image. Based on the aerial image, an auxiliary pattern is placed near a peak position expect for a pattern to be resolved.

According to the method disclosed in Japanese Patent Laid-Open No. 2005-183981, for example, a contact hole pattern is replaced with a Dirac delta function. The delta function and a point spread function are convoluted to generate an interference map. An auxiliary pattern with a transmittance of 100% and a phase shift of 0° is placed in a region in which the interference map takes a positive value. An auxiliary pattern with a transmittance of 100% and a phase shift of 180° is placed in a region in which the interference map takes a negative value.

According to the method disclosed in Japanese Patent Laid-Open No. 2008-40470, a contact hole is regarded as a pattern with a nonzero size, and an aerial image is calculated by a TCC function. Then, an auxiliary pattern with a transmittance of 100% and a phase shift of 0° is placed in a region in which the aerial image takes a positive value. An auxiliary pattern with a transmittance of 100% and a phase shift of 180° is placed in a region in which the aerial image takes a negative value.

However, neither reference considers the possibility that an auxiliary pattern with a phase shift of 0° and that with a phase shift of 180° partially overlap each other, and processing executed upon overlapping.

SUMMARY OF THE INVENTION

The present invention provides a technique for generating reticle data in consideration of the possibility that auxiliary patterns overlap each other.

One of the aspects of the present invention provides a method of generating reticle data for producing a reticle used in an exposure apparatus in which a projection optical system projects a pattern of the reticle onto a substrate, the pattern of the reticle including a main pattern, a first auxiliary pattern, and a second auxiliary pattern, the first auxiliary pattern and the second auxiliary pattern being patterns not to resolve, light having passed through the first auxiliary pattern and light having passed through the main pattern being in phase, and light having passed through the second auxiliary pattern and light having passed through the main pattern having a phase difference of 180° from each other, the method comprising the steps of determining the main pattern based on an aerial image formed on an image plane of the projection optical system when a target pattern is placed on an object plane of the projection optical system, determining the first auxiliary pattern and the second auxiliary pattern based on the aerial image formed on the image plane when either of the target pattern and the main pattern is placed on the object plane, and when the first auxiliary pattern and the second auxiliary pattern overlap each other, deleting either of the first auxiliary pattern and the second auxiliary pattern or deforming at least either of the first auxiliary pattern and the second auxiliary pattern.

Further features of the present invention will become apparent from the following description of exemplary embodiments with reference to the attached drawings.

BRIEF DESCRIPTION OF THE DRAWINGS

FIGS. 5A and 5B are views exemplifying a target pattern and effective light source;

FIGS. 29A and 29B are views exemplifying reticle patterns;

FIG. 30 is a view exemplifying a two-dimensional image obtained by precision calculation;

DESCRIPTION OF THE EMBODIMENTS

The present invention is applicable to generating reticle data for producing a reticle used in the manufacture of various devices including semiconductor devices (e.g., an IC, LSI, and CCD), display devices (e.g., a liquid crystal panel), magnetic devices (e.g., a magnetic head), and devices by micromechanics. The micromechanics means a micrometer-order sophisticated mechanical system and a technique of producing it by applying a semiconductor device manufacturing technique to the production of a microstructure. The present invention is useful for, e.g., immersion exposure of immersing the final surface of a projection optical system and the surface of a substrate into a liquid and forming a latent pattern on a photosensitive member via the projection optical system and liquid. The present invention is also suitable for a method of reducing the k1 factor.

The concept disclosed in this specification can be modeled mathematically. Hence, the present invention can be implemented as a software function of a computer system. The software function of the computer system includes programming having executable codes, and can determine a reticle pattern and generate reticle data. A general-purpose computer can execute the software codes. During execution of the software codes, codes or related data records are stored in the platform of the general-purpose computer. In other cases, the software is stored in another site or loaded into an appropriate general-purpose computer system. At least one computer-readable medium can hold the software codes as one or a plurality of modules. The present invention to be described below is described in the form of codes mentioned above, which can function as one or a plurality of software products. The processor of the computer system executes the software codes.

Figure 37:
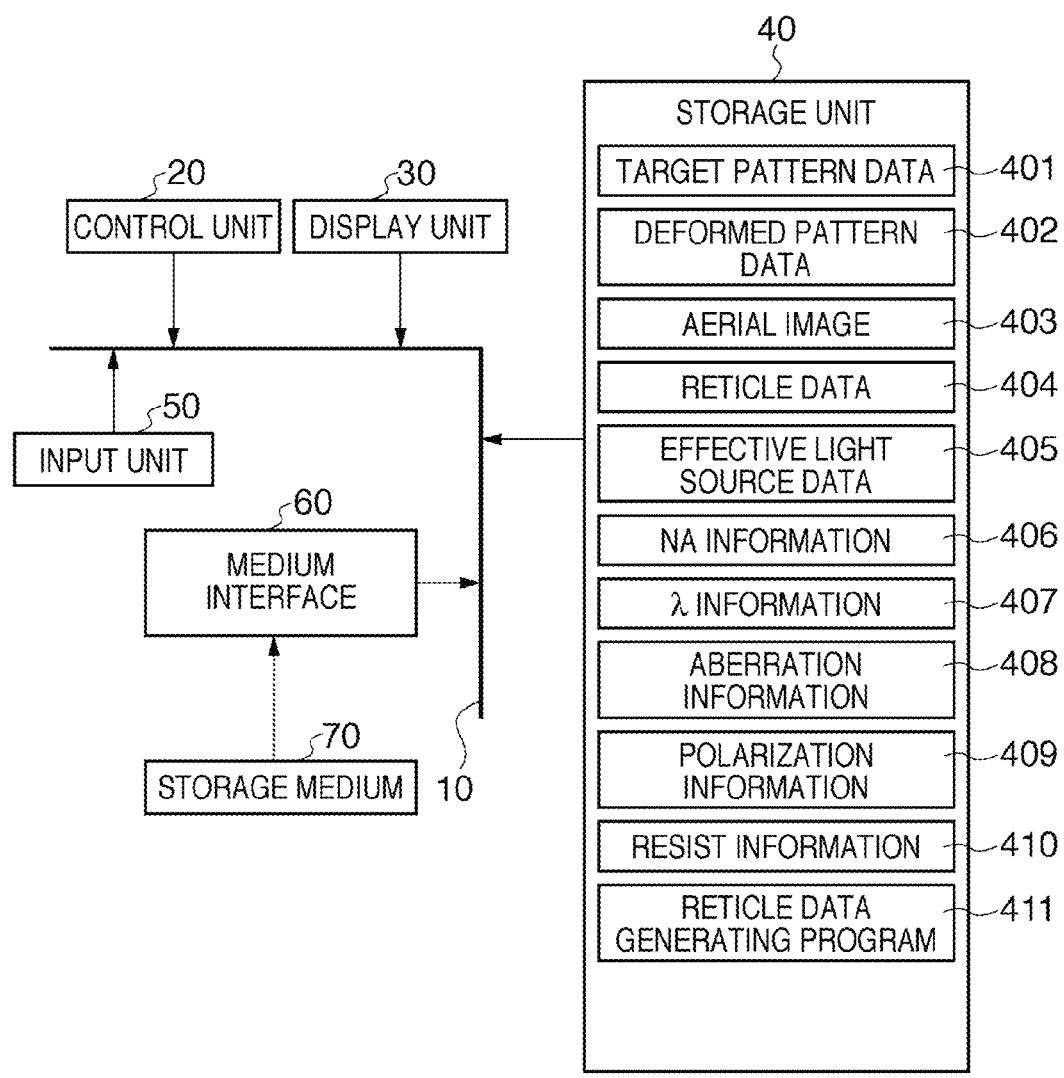
FIG. 37 is a schematic block diagram showing the arrangement of a processing apparatus (computer) which executes a reticle data generating method according to the embodiment of the present invention.

FIG. 37 is a schematic block diagram showing the arrangement of an information processing apparatus (computer) 1 which executes a reticle data generating method according to the embodiment of the present invention. The information processing apparatus 1 is formed from, e.g., a general-purpose computer, and includes a bus line 10, control unit 20, display unit 30, storage unit 40, input unit 50, and medium interface 60, as shown in FIG. 37.

The bus line 10 interconnects the control unit 20, display unit 30, storage unit 40, input unit 50, and medium interface 60. The control unit 20 is formed from a CPU, GPU, DSP, or microcomputer, and includes a cash memory for primary storage. In response to an instruction input by the user via the input unit 50 to start up a reticle data generating program 411, the control unit 20 executes the reticle data generating program 411 stored in the storage unit 40.

The display unit 30 can include, for example, a display device such as a liquid crystal display. The display unit 30 displays, e.g., information associated with execution of the reticle data generating program 411 (e.g., an aerial image 403, reticle data 404, and effective light source data 405).

The storage unit 40 can include, for example, a semiconductor memory and hard disk. The storage unit 40 stores the reticle data generating program 411 provided from a storage medium 70 connected to the medium interface 60. The storage unit 40 can further store target pattern data 401, deformed pattern data 402, the aerial image 403, the reticle data 404, the effective light source data 405, NA information 406, λ information 407, aberration information 408, polarization information 409, and resist information 410.

The target pattern data 401 is data of a pattern (also called a layout pattern or target pattern) laid out in designing an integrated circuit or the like. The target pattern data 401 is input information for determining a reticle pattern.

The deformed pattern data 402 is data containing a main pattern obtained by deforming a target pattern so as to form the target pattern. The deformed pattern data 402 can contain an auxiliary pattern. The deformed pattern data 402 is generated by executing the reticle data generating program 411. The main pattern may be a target pattern itself, but is typically a pattern generated by executing the reticle data generating program 411, i.e., a deformed target pattern. The difference between the main pattern and the auxiliary pattern resides in whether the pattern is resolved. A pattern to be resolved is called a main pattern, and one not to be resolved is called an auxiliary pattern.

The reticle data 404 is data for drawing a pattern such as a Cr pattern on a reticle plate. The reticle data 404 is final pattern data obtained by executing the reticle data generating program 411. The reticle data 404 contains data of main and auxiliary patterns.

Note that the target pattern data 401, deformed pattern data 402, and reticle data 404 can contain the positions, sizes, shapes, transmittances, and phase information of main and auxiliary patterns. The target pattern data 401, deformed pattern data 402, and reticle data 404 also contain the transmittance and phase information of a region (background) where neither the main pattern nor auxiliary pattern exists.

The aerial image 403 is an aerial image (three-dimensional light intensity distribution) formed by interference of light on the surface of a substrate. The aerial image 403 can be an approximated aerial image formed by interference between principal diffracted rays on the substrate surface. A method using an approximated aerial image without calculating a precision aerial image in pattern deformation is advantageous because the calculation time is very short and the coherence between patterns is enhanced to facilitate understanding of the proximity effect. The method of calculating an approximated aerial image is disclosed in Japanese Patent Laid-Open No. 2005-183981.

An approximated aerial image can also be calculated using an interference map (IML) described in Japanese Patent Laid-Open No. 2004-221594 upon deformation as follows.

The TCC undergoes singular value decomposition. $\lambda_i$ is defined as the ith eigenvalue, and $\Phi_i(f,g)$ is defined as the ith eigenfunction. Note that (f,g) is the coordinate value of the pupil plane. In Japanese Patent Laid-Open No. 2004-221594, an interference map e(x,y) is regarded as the sum of a plurality of eigenfunctions. That is, the interference map e(x,y) is given by $$e(x, y) = \sum_{i=1}^{N'} \sqrt{\lambda_i} \, FT[\Phi_i(f, g)] \tag{1}$$

where FT is a Fourier transform. N' is generally 1. Further in Japanese Patent Laid-Open No. 2004-221594, a mask pattern (target pattern) is replaced with points or lines and convoluted with the interference map, deriving the interference map of the entire mask.

More specifically, e(x,y) represents simple coherence. By convoluting e(x,y) and a mask whose pattern is replaced with points or lines, the interference map of the entire mask can be obtained. However, a conventional IML technique does not consider the pattern shape. Hence, an interference map e'(x,y) considering the pattern shape will be examined.

An interference map derivation method considering the pattern shape will be explained. The TCC undergoes singular value decomposition. $\lambda_i$ is defined as the ith eigenvalue, and $\Phi_i(f,g)$ is defined as the ith eigenfunction. Further, a(f,g) is defined as the diffracted light distribution of the mask function (Fourier transform of the mask function). The interference map e'(x,y) considering a mask pattern (target pattern) is derived from $$e'(x, y) = \sum_{i=1}^{N'} \sqrt{\lambda_i} \, FT[a(f, g)\Phi_i(f, g)] \tag{2}$$

By using equation (2), the interference map e'(x,y) considering a mask pattern (target pattern) can be attained.

The effective light source data 405 is associated with a light intensity distribution formed on the pupil plane of the projection optical system of the exposure apparatus. The NA information 406 is associated with the image-side numerical aperture (NA) of the exposure apparatus. The λ information 407 is associated with the wavelength λ of exposure light of the exposure apparatus. The aberration information 408 is associated with aberration of the projection optical system of the exposure apparatus. When the projection optical system of the exposure apparatus has birefringence, a phase shift occurs in accordance with the birefringence. This phase shift can be regarded as a kind of aberration. The polarization information 409 is associated with the polarization state of illumination light emitted by the illumination device of the exposure apparatus. The resist information 410 is associated with a resist applied to a substrate.

The reticle data generating program 411 is used to generate the reticle data 404 based on the supplied target pattern data 401 by causing the information processing apparatus (computer) 1 to execute the reticle data generating method.

The input unit 50 includes, for example, a keyboard and mouse. The user can input information via the input unit 50 for the reticle data generating program 411. The medium interface 60 includes, for example, a floppy disk drive, CD-ROM drive, and USB interface, and is connectable to the storage medium 70. The storage medium 70 includes, for example, a floppy disk, CD-ROM, and USB memory, and can be used to provide the information processing apparatus 1 with the reticle data generating program 411 and other programs to be executed by the information processing apparatus 1.

Figure 1A:
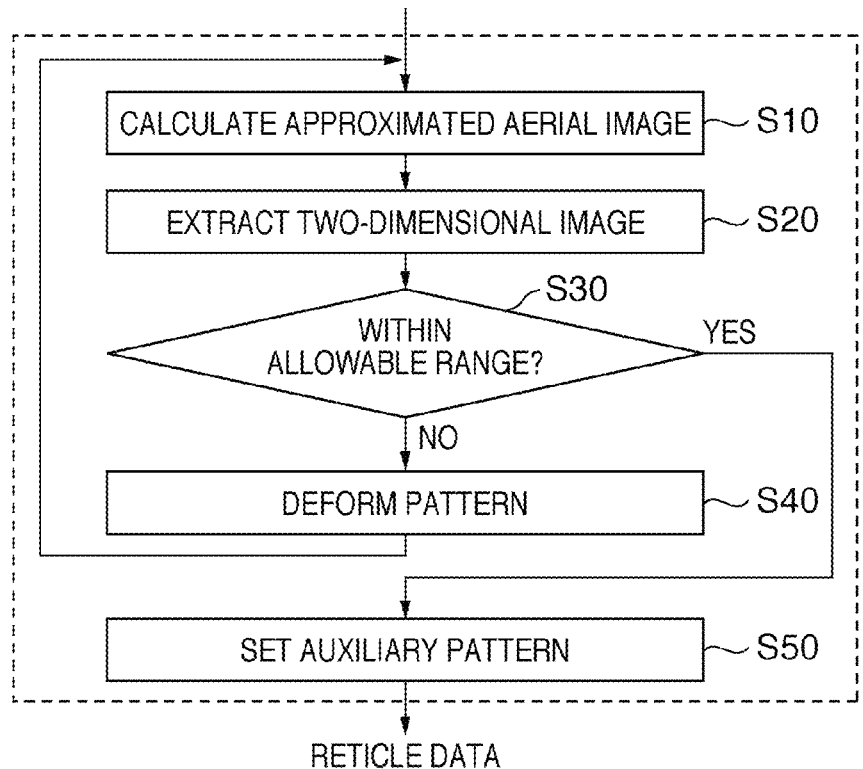
FIG. 1A is a flowchart schematically showing the sequence of reticle data generating processing executed by an information processing apparatus in accordance with a reticle data generating program in an embodiment of the present invention.

FIG. 1A is a flowchart schematically showing the sequence of reticle data generating processing executed by the information processing apparatus 1 in accordance with the reticle data generating program 411 in the embodiment of the present invention. Input information in the reticle data generating processing includes, for example, the target pattern data 401, effective light source data 405, NA information 406, $\lambda$ information 407, aberration information 408, polarization information 409, and resist information 410. Output information in the reticle data generating processing includes the reticle data 404.

In step S10, an aerial image (preferably an approximated aerial image according to the foregoing method) is calculated based on input information. When step S10 is executed for the first time, an aerial image when a target pattern corresponding to the target pattern data 401 is placed on the object plane of the projection optical system of the exposure apparatus is calculated. After the pattern is deformed in step S40, an aerial image when the deformed pattern is placed on the object plane of the projection optical system of the exposure apparatus is calculated.

In step S20, the aerial image calculated in step S10 is sliced at a reference slice value Io to calculate a two-dimensional image which is a section of the aerial image. For a light-transmitting pattern, the two-dimensional image is obtained by extracting, from the aerial image, a portion having an intensity value equal to or larger than the reference slice value.

In step S30, the target pattern represented by the target pattern data 401 is compared with the two-dimensional image obtained in step S20 to evaluate whether the two-dimensional image falls within an allowable range. Examples of evaluation parameters are the line width and pattern dimension. NILS (Normalized Image Log Slope) and intensity peak value may also be taken into account. If the obtained two-dimensional image falls within the allowable range, the process advances to step S50. A pattern finally used to calculate an aerial image and two-dimensional image is set as a main pattern. If the obtained two-dimensional image does not fall within the allowable range, the process advances to step S40.

In step S40, the pattern (target pattern represented by the target pattern data 401 at first) used to calculate a two-dimensional image is deformed, and the process returns to step S10. By repeating steps S10, S20, and S40, a main pattern is determined using the target pattern as an initial pattern.

In step S50, an auxiliary pattern is determined. The position of the auxiliary pattern can be determined based on, for example, an aerial image formed on the image plane of the projection optical system when the target pattern or a finally obtained main pattern is placed on the object plane of the projection optical system. As the aerial image, one calculated in step S10 may be used.

The auxiliary pattern can be placed with a predetermined size at a position where the aerial image value does not exceed the reference slice value Io and the auxiliary pattern does not overlap a pattern to be resolved. Alternatively, the auxiliary pattern can be placed with a size corresponding to an extreme at a position where the aerial image value does not exceed the reference slice value Io, the auxiliary pattern does not overlap the main pattern, and the aerial image has the extreme.

Although not shown, main and auxiliary patterns are merged to determine a reticle pattern, and reticle data 404 representing the reticle pattern is generated.

One aspect of the present invention is directed to a reticle production method, and one embodiment includes a step of generating reticle data by the above-mentioned reticle data generating processing and a step of producing a reticle according to the reticle data. The reticle can be typically produced by drawing a reticle pattern on a reticle substrate by an electron beam lithography apparatus or the like in accordance with reticle data.

Figure 1B:
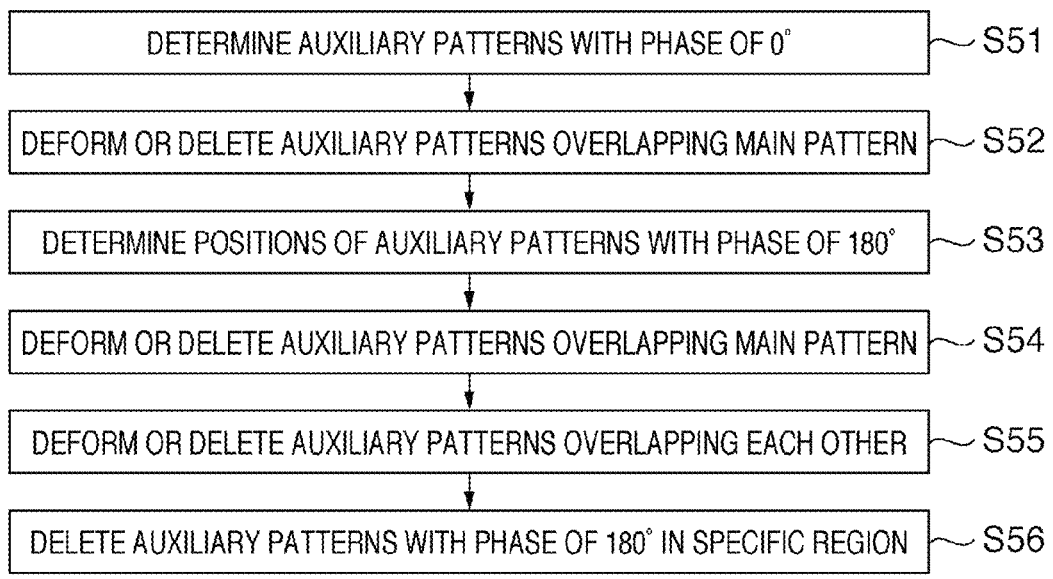
FIG. 1B is a flowchart showing the more detailed sequence of auxiliary pattern setting processing in step S50 of FIG. 1A.

FIG. 1B is a flowchart showing the more detailed sequence of the auxiliary pattern setting processing in step S50 of FIG. 1A. In step S51, auxiliary patterns with a phase difference of 0° from the main pattern are determined based on the aerial image obtained in step S10. The auxiliary pattern with a phase difference of 0° from the main pattern means an auxiliary pattern in which light having passed through the auxiliary pattern and light having passed through the main pattern are in phase. This auxiliary pattern corresponds to the first auxiliary pattern described in the appended claims.

In step S52, auxiliary patterns overlapping the main pattern among those determined in step S51 are removed or deformed. The auxiliary patterns determined in step S51 can take, e.g., a predetermined size or a size corresponding to the extreme of the aerial image. Even if the typical position is set so that the auxiliary pattern does not overlap the main pattern, the auxiliary pattern may partially overlap the main pattern.

In step S53, auxiliary patterns with a phase difference of 180° from the main pattern are determined based on the aerial image obtained in step S10. The auxiliary pattern with a phase difference of 180° from the main pattern means an auxiliary pattern in which light having passed through the auxiliary pattern and light having passed through the main pattern have a phase difference of 180°. This auxiliary pattern corresponds to the second auxiliary pattern described in the appended claims. In step S54, auxiliary patterns overlapping the main pattern among those determined in step S53 are removed or deformed.

In step S55, either or both of auxiliary patterns overlapping each other among the auxiliary patterns with a phase difference of 0° from the main pattern and those with a phase difference of 180° are deformed, or either of them is deleted. In step S56, auxiliary patterns present in a specific region determined based on the target pattern are removed.

In this processing, the processing order of auxiliary patterns with a phase difference of 0° and those with a phase difference of 180° may be reversed.

Based on a reticle pattern (reticle data) finally obtained in this fashion, an aerial image or two-dimensional image formed on the image plane of the projection optical system when the reticle pattern is placed on the object plane of the projection optical system can be recalculated and evaluated. At this time, the time taken for calculation does not matter, so it is preferable to precisely calculate an aerial image.

Figure 2A:
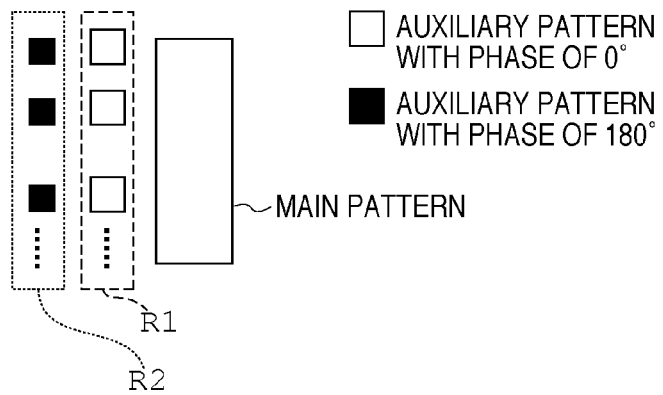
FIGS. 2A, 2B, and 2C are views exemplifying auxiliary pattern placements.
Figure 2B:
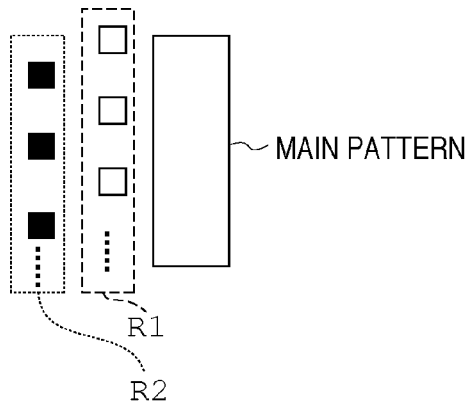
Figure 2C:
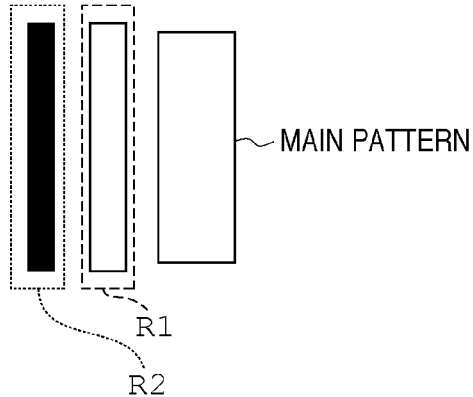

FIGS. 2A, 2B, and 2C are views exemplifying auxiliary pattern placements. FIG. 2A illustrates an auxiliary pattern placement in a case in which different phases overlap each other upon translation. FIG. 2B illustrates an auxiliary pattern placement in a case in which different phases do not overlap each other upon translation. FIG. 2C illustrates an auxiliary pattern placement in a case of continuous auxiliary patterns. A grid pattern with a predetermined interval is assumed on a reticle, and the grid pattern is scanned in two directions perpendicular to each other. All positions where the approximated aerial image calculated in step S10 locally takes a maximum value are extracted. An auxiliary pattern with a phase difference of 0° from the main pattern is placed at, among the extracted positions, a position within a region (R1) in which the approximated aerial image exceeds the first threshold. Similarly, the two-dimensional image is scanned in the two directions, and all positions where the approximated aerial image calculated in step S10 takes a minimum value are extracted. An auxiliary pattern with a phase difference of 180° from the main pattern is placed at, among the extracted positions, a position within a region (R2) in which the approximated aerial image does not exceed the second threshold.

The positional relationship between the auxiliary pattern with a phase difference of 0° from the main pattern and that with a phase difference of 180° is not particularly limited. For example, these auxiliary patterns can be placed as shown in FIGS. 2A, 2B, and 2C. An auxiliary pattern overlapping the main pattern is deformed or deleted in step S52 or S54. The first and second thresholds may be the same or different values. It is preferable that auxiliary patterns have a size small enough not to resolve and all of them have almost the same size. In some cases, many auxiliary patterns are placed close to each other, resulting in a continuous auxiliary pattern as shown in FIG. 2C, which is regarded as a single auxiliary pattern. In the design of a reticle, it is preferable to independently place small element patterns, as shown in FIGS. 2A and 2B. This method is discriminated from a method of simultaneously arranging a line pattern equal in size to a main pattern, like a scattering bar. Which of the methods was adopted to generate a reticle pattern can be determined depending on whether a reticle pattern has a smooth linear contour or nonuniform nonlinear one.

Figure 3:
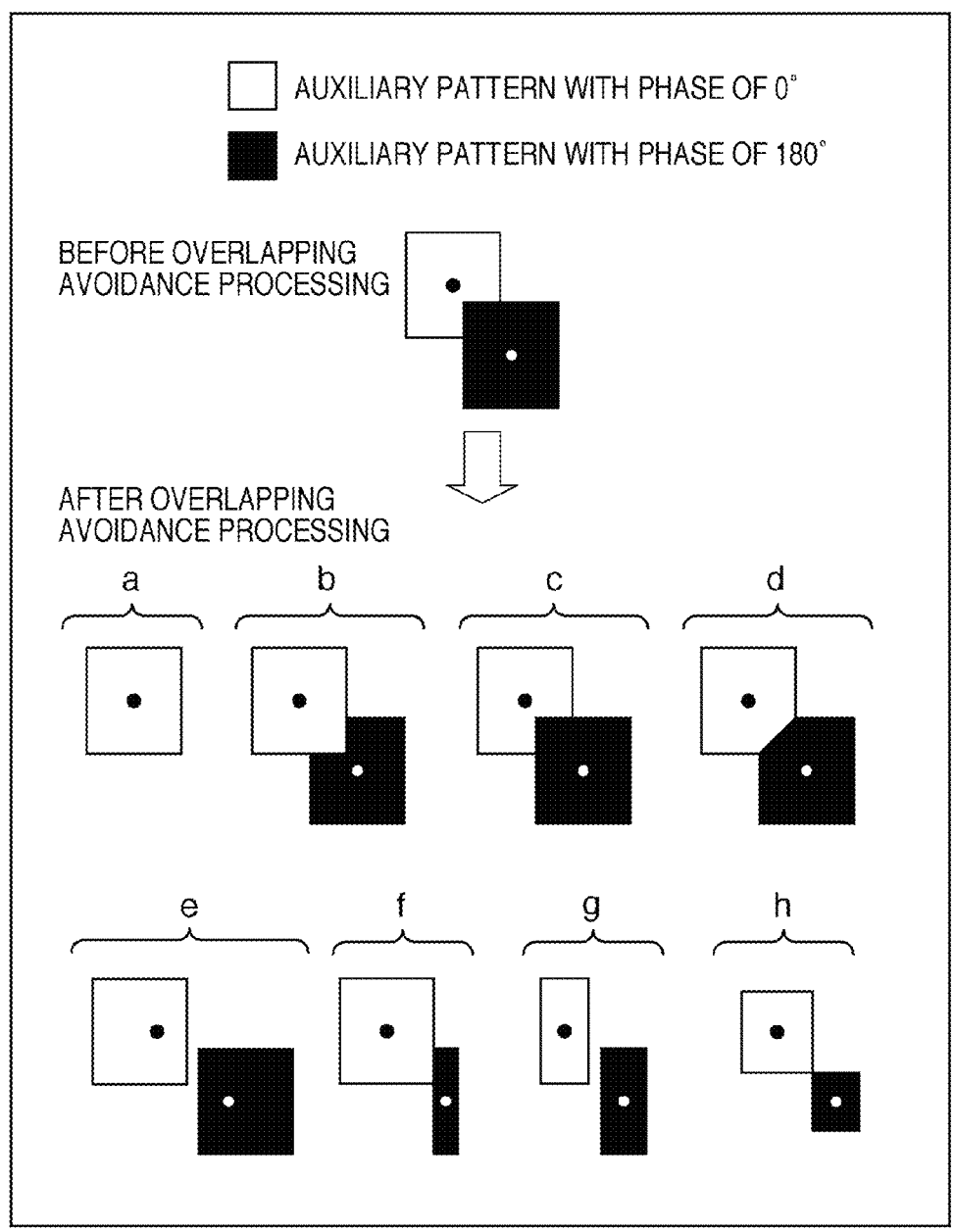
FIG. 3 is a view exemplifying auxiliary pattern overlapping avoidance processing.

The processing in step S55, i.e., processing (to be referred to as overlapping avoidance processing) executed when an auxiliary pattern (first auxiliary pattern) with a phase difference of 0° from the main pattern and an auxiliary pattern (second auxiliary pattern) with a phase difference of 180° overlap each other will be explained in detail. In FIG. 3, blank rectangles and polygons represent auxiliary patterns with a phase difference of 0° from the main pattern. Black rectangles and polygons represent auxiliary patterns with a phase difference of 180° from the main pattern. Open and full circles indicate the positions of auxiliary patterns.

In FIG. 3, a to h exemplify the overlapping avoidance processing. a exemplifies processing of deleting either of the auxiliary pattern with a phase difference of 0° and the auxiliary pattern with a phase difference of 180° that overlap each other. It is desirable to delete the auxiliary pattern with a phase difference of 180° out of the auxiliary pattern with a phase difference of 0° and that with a phase difference of 180°. b exemplifies processing of deleting the overlapping portion of the auxiliary pattern with a phase difference of 180° out of the auxiliary pattern with a phase difference of 0° and the auxiliary pattern with a phase difference of 180° that overlap each other. c exemplifies processing of deleting the overlapping portion of the auxiliary pattern with a phase difference of 0° out of the auxiliary pattern with a phase difference of 0° and the auxiliary pattern with a phase difference of 180° that overlap each other. d exemplifies processing of defining a boundary at a portion where the auxiliary pattern with a phase difference of 0° overlap the auxiliary pattern with a phase difference of 180°, and dividing the overlapping portion at the boundary into the auxiliary pattern with a phase difference of 0° and that with a phase difference of 180°. e exemplifies processing of translating either or both of the auxiliary pattern with a phase difference of 0° and the auxiliary pattern with a phase difference of 180° that overlap each other, until overlapping is canceled.

f exemplifies processing of reducing the width of either of the auxiliary pattern with a phase difference of 0° and the auxiliary pattern with a phase difference of 180° that overlap each other, until overlapping is canceled. g exemplifies processing of reducing the widths of both of the auxiliary pattern with a phase difference of 0° and the auxiliary pattern with a phase difference of 180° that overlap each other, until overlapping is canceled. h exemplifies processing of reducing the short and long sides of either or both of the auxiliary pattern with a phase difference of 0° and the auxiliary pattern with a phase difference of 180° that overlap each other, until overlapping is canceled.

When three or more auxiliary patterns overlap each other, it suffices to, for example, sequentially select two arbitrary auxiliary patterns overlapping each other and execute the above-described deformation or deletion for them. This processing is repeated until overlapping is canceled.

Figure 4A:
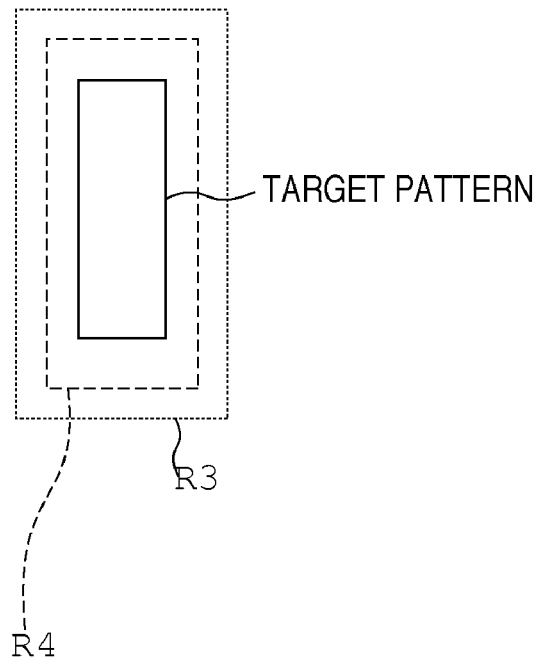
FIGS. 4A and 4B are views exemplifying auxiliary pattern placement rules.
Figure 4B:
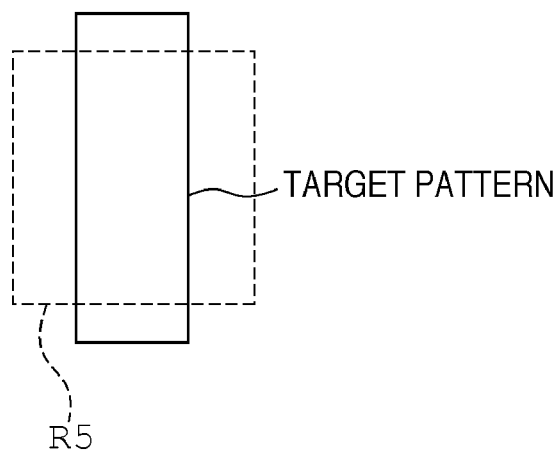

A region in which placement of an auxiliary pattern is permitted and/or a region in which it is forbidden may be defined as a placement rule. According to a placement rule shown in FIG. 4A (conceptual view of auxiliary pattern placement region), in either or both of the long- and short-side directions of the target pattern, a region (R3) in which an auxiliary pattern with a phase difference of 0° from the main pattern can be placed contains a region (R4) in which an auxiliary pattern with a phase difference of 180° from the main pattern can be placed. This placement rule is effective for improving the image characteristic. A placement rule shown in FIG. 4B (conceptual view of auxiliary pattern forbidden region) forbids placement of an auxiliary pattern with a phase difference of 180° from the main pattern in a forbidden region (R5) indicated by a dotted line. This placement rule is also preferable to improving the image characteristic, and corresponds to the processing in step S56 of FIG. 1B. The forbidden region is, e.g., a rectangle which contains the center of a target pattern and crosses its long side. When the target pattern is a rectangle other than a square, the forbidden region can be determined from the lengths of the long and short sides. In some cases, the forbidden region should not be arranged when, for example, the target pattern is a square or almost a square.

The forbidden region may be determined in accordance with the density of a target pattern. In this case, for example, a table representing the relationship between the density and the forbidden region is prepared. A forbidden region corresponding to the density can be selected and used.

Alternatively, the forbidden region may be determined in accordance with an illumination condition (condition to illuminate a reticle). In this case, for example, a table representing the relationship between the illumination condition and the forbidden region is prepared. A forbidden region corresponding to the illumination condition can be selected and used.

Terms used in the specification will be explained. $\lambda$ represents the wavelength of exposure light used in an exposure apparatus 100 (see FIG. 12), and NA represents the image-side numerical aperture of a projection optical system 140. $\sigma$ represents the ratio between the numerical aperture of a light beam incident on a reticle 130 (the object plane of the projection optical system 140) via an illumination optical system 120 and the object-side numerical aperture of the projection optical system 140.

Since the exposure apparatus can take various NA values and λ values, it is convenient to normalize the pattern size by (λ/NA). For example, for λ=193 nm and NA=0.93, a pattern size of 65 nm is normalized to 0.31. This normalization will be referred to as k1 conversion in the specification.

A pattern size on the reticle surface and that on the substrate surface are different by the magnification of the projection optical system. For descriptive convenience, the magnification of the projection optical system is assumed to be 1:1. Hence, a coordinate system on the reticle surface and that on the substrate surface have a one-to-one correspondence.

Several embodiments will be described below.

First Embodiment

In an exposure apparatus, the NA of the projection optical system is 0.93 and the wavelength of exposure light is 193 nm. The projection optical system is stigmatic and exposure light (light which illuminates a reticle) is unpolarized light. No resist is considered. The target pattern is a light-transmitting isolated line pattern having a line width of 65 nm and a length of 1,300 nm, as shown in FIG. 5A. In the line pattern shown in FIG. 5A, the transmittance within the rectangle is 1, that of the background is 0, and all the phases of the target pattern are 0°. This also applies to the following embodiments.

The barycenter of the rectangle is set as an origin, a direction along the short side is defined as the x-axis, and a direction along the long side is defined as the y-axis. The effective light source (light intensity distribution formed on the pupil of the illumination optical system) is a quadrupole illumination as shown in FIG. 5B. In FIG. 5B, a blank circle corresponds to σ=1, a blank portion is a light-emitting portion, and there are four light-emitting portions. The effective light source shown in FIG. 5B is employed, unless otherwise specified.

Figure 6A:
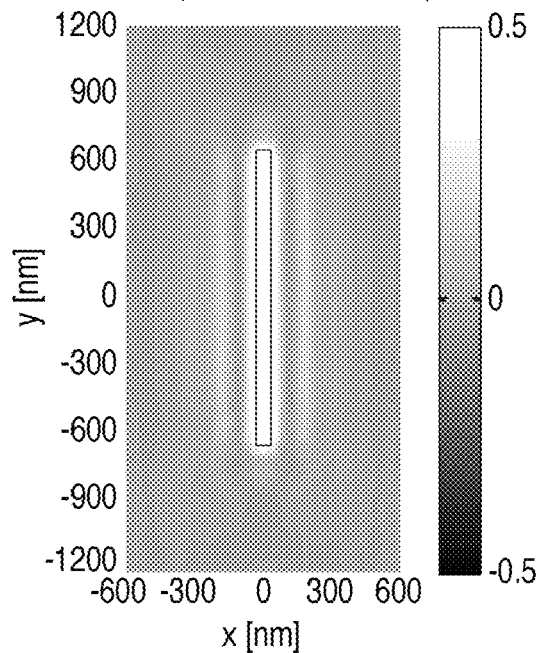
FIGS. 6A and 6B are views exemplifying approximated aerial images.

An approximated aerial image formed on the image plane when the target pattern is placed on the object plane of the projection optical system is calculated under the above-described conditions, obtaining a result as shown in FIG. 6A. In FIG. 6A, the target pattern is overwritten with a black line.

Figure 6B:
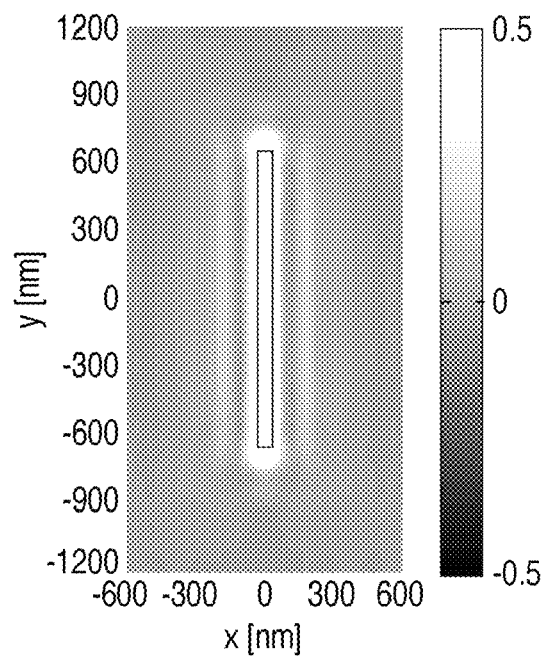

As is apparent from FIG. 6A, the initial approximated aerial image does not have a sufficient margin along the long side, compared to the target pattern. Further, an approximated aerial image after deforming the main pattern according to a method to be described later is calculated, obtaining a result as shown in FIG. 6B. In FIG. 6B, the intensity distribution within the overwritten target pattern is almost uniform, improving the shortening along the long side.

Figure 8A:
FIGS. 8A and 8B are views exemplifying two-dimensional sectional images.
Figure 8B:
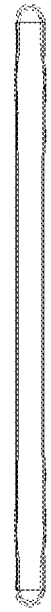

FIGS. 8A and 8B show two-dimensional sectional images obtained by slicing approximated aerial images as shown in FIGS. 6A and 6B at the reference slice value Io, 0.8 Io, and 1.2 Io. In FIGS. 8A and 8B, the target pattern is overwritten with a straight line. Based on FIGS. 8A and 8B, a change of the shape of the reference slice sectional image can be evaluated, and the degree of slope and Log-slope can be evaluated from the density of contours. Note that the reference slice value Io is also expressed as a threshold.

Figure 7A:
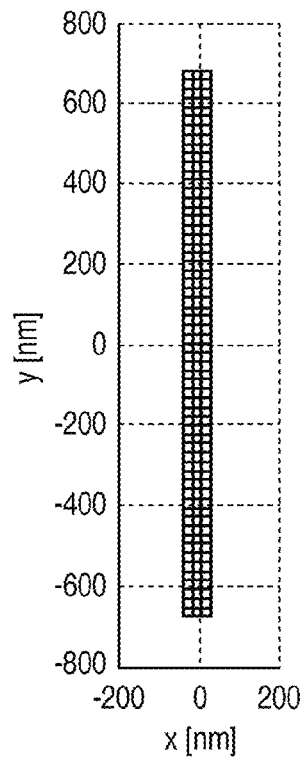
FIGS. 7A and 7B are views exemplifying patterns.

The main pattern can be deformed by, e.g., the following procedures. As shown in FIG. 7A, a target pattern or a pattern during deformation (initial value is equal to the target pattern) is divided into a plurality of elements, and a two-dimensional sectional image is also divided by the same division number.

Figure 7B:
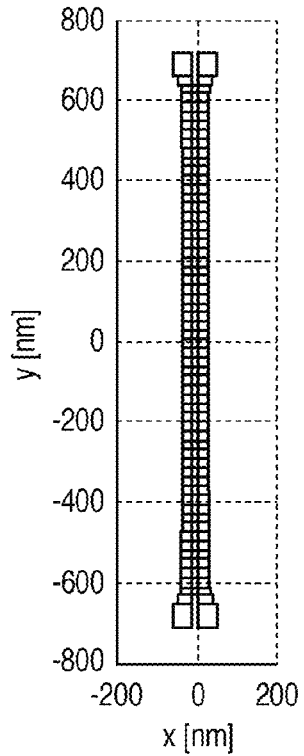

An element of the target pattern and an element of the two-dimensional sectional image at the same position are compared, and the pattern during deformation is corrected based on the difference. At this time, the target pattern is not deformed. In contrast, in the pattern during deformation, an unnecessary element is removed, a new element is added, or an element is deformed. As a result, a deformed pattern as shown in FIG. 7B is attained.

The deformed pattern is set as a new pattern. An approximated aerial image formed on the image plane when the deformed pattern is placed on the object plane of the projection optical system, and a two-dimensional sectional image are obtained. The same processing is repeated until the difference becomes equal to or smaller than a predetermined value.

In the approximated aerial image as shown in FIG. 6B obtained by the above processing, the peak position of a portion which does not overlap the target pattern is attained. For a transparent pattern, a position having a local maximum value equal to or larger than a threshold is obtained. At this position, an auxiliary pattern which is a square 40 nm on a side and has a phase of 0° is placed. The approximated aerial image does not take a negative value, so a phase-inversed auxiliary pattern cannot be placed by the methods in Japanese Patent Laid-Open Nos. 2005-183981 and 2008-40470. As an alternative means, a position having a local minimum value smaller than the threshold is obtained. At this position, an auxiliary pattern which is a square 40 nm on a side and has a phase of 180° is placed. As for a line pattern, it suffices to perform search by scanning in two directions, i.e., a direction perpendicular to the longitudinal direction of the line and the longitudinal direction of the line.

The auxiliary pattern should have a size small enough not to resolve and optimum for improving characteristics. In the first embodiment, "40 nm" is selected as a size which most improves the image performance. The position where the auxiliary pattern is placed may be replaced with the barycenter near the peak position.

Figure 9A:
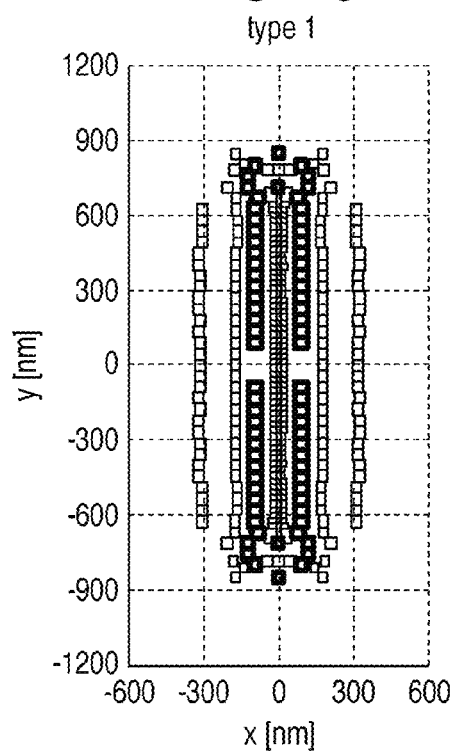
FIGS. 9A, 9B, and 9C are views exemplifying reticle patterns.
Figure 9B:
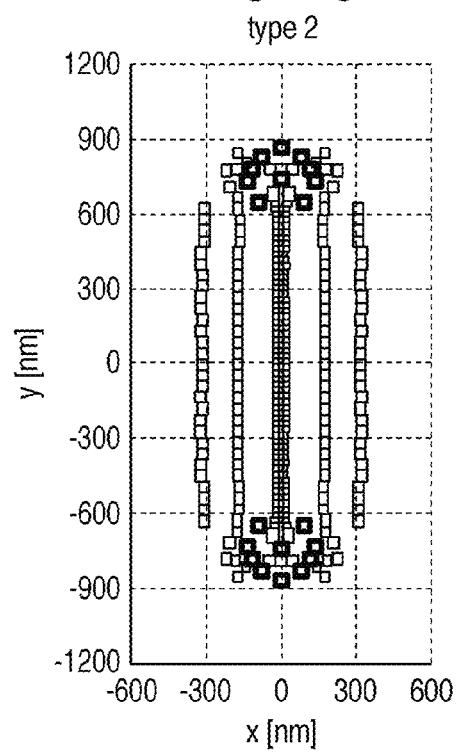
Figure 9C:
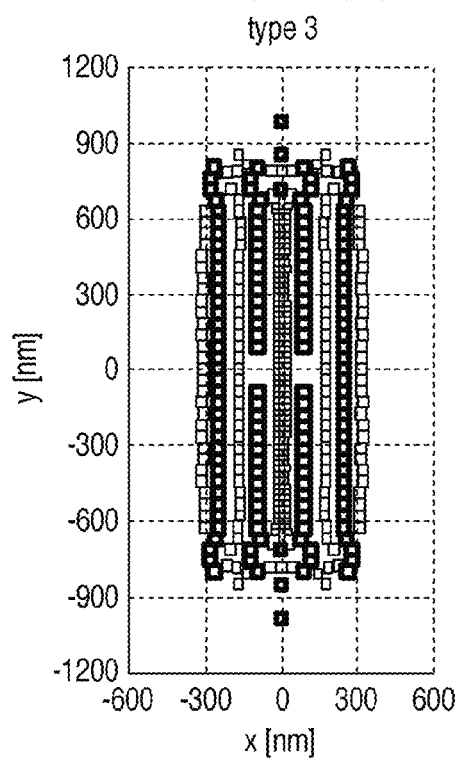

FIGS. 9A, 9B, and 9C show reticle patterns each obtained by merging auxiliary patterns with phases of 0° and 180° and a deformed main pattern. In FIGS. 9A to 9C, a thin line indicates a pattern with a phase of 0° and a thick line indicates a pattern with a phase of 180°. The reticle pattern description method in other drawings also complies with this description method in FIGS. 9A to 9C.

FIG. 9C shows a reticle pattern obtained by superimposing a deformed pattern (i.e., main pattern) and all auxiliary patterns.

In the reticle pattern shown in FIG. 9C, the effects of auxiliary patterns with a phase of 180° are checked one by one to remove ineffective auxiliary patterns and auxiliary patterns having an adverse effect. To confirm the effects of auxiliary patterns, an approximated aerial image is calculated using, as a reticle pattern, a pattern obtained by merging auxiliary patterns with a phase of 180° to be checked, all auxiliary patterns with a phase of 0°, and a main pattern. As evaluation criteria for the image performance, general evaluation indices such as NILS, contrast, intensity peak, and CD are available. By checking whether any of these evaluation indices degrades or improves, the effects of auxiliary patterns with a phase of 180° are confirmed. The deformed pattern (i.e., main pattern) and auxiliary patterns with a phase of 180° having an adverse effect are searched for in a direction perpendicular to the longitudinal direction of the line. The detected patterns are removed, and the remaining patterns are merged as shown in FIG. 9A.

A search is similarly done in the direction perpendicular to the longitudinal direction of the line, removing auxiliary patterns except for those with a phase of 180° having an effect of improving the image performance, as shown in FIG. 9B. It was confirmed by simulation whether an image formed on the image plane using the resultant pattern as a reticle pattern was a desired one.

Figure 10:
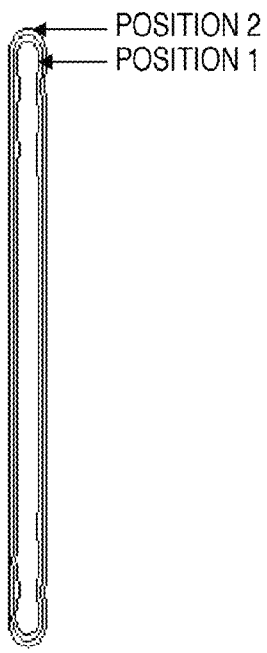
FIG. 10 is a view exemplifying a two-dimensional image obtained by precision calculation.
Figure 11A:
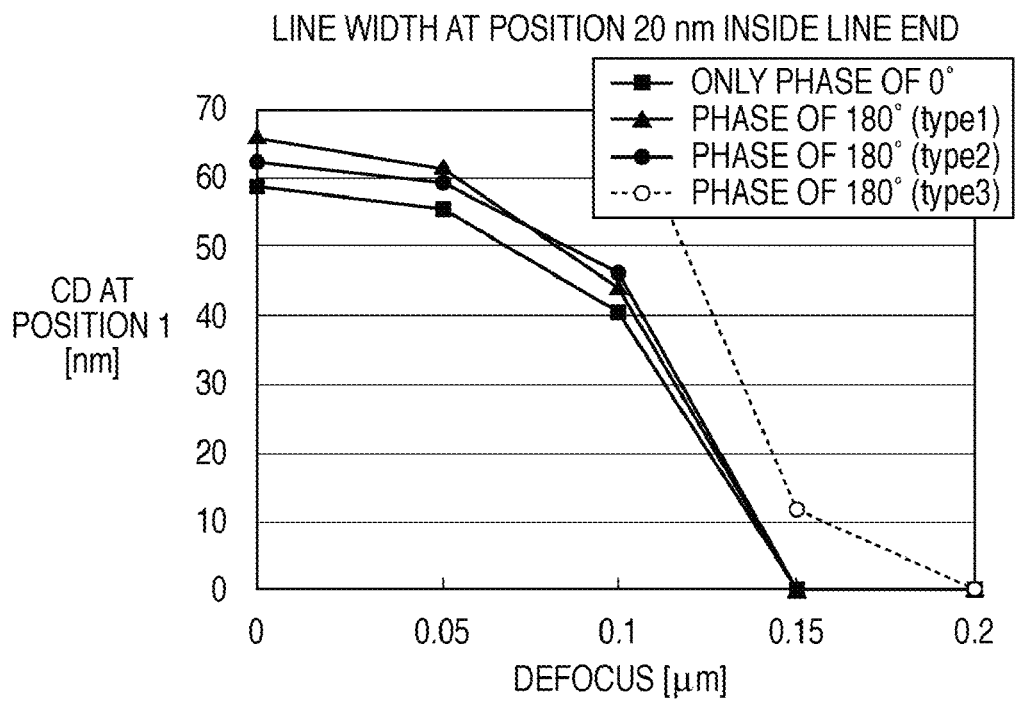
FIGS. 11A and 11B are graphs exemplifying evaluation results.
Figure 11B:
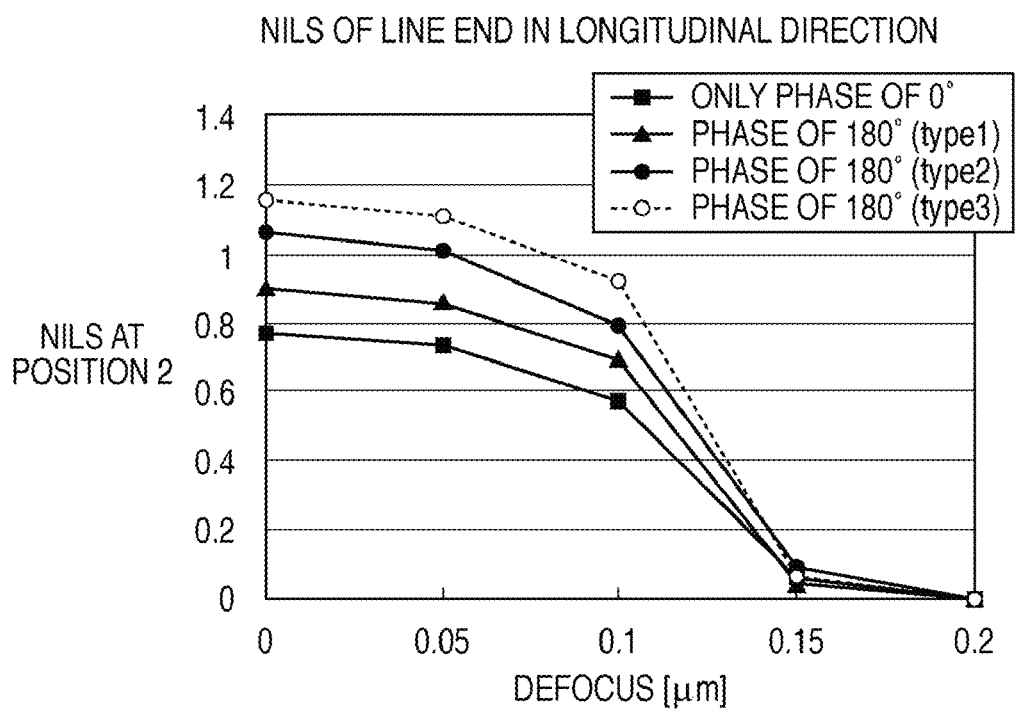

A reticle pattern or reticle data is finally evaluated using not an approximated aerial image but a precisely calculated aerial image. FIG. 10 shows a two-dimensional image obtained by precision calculation. FIGS. 11A and 11B show results of calculating a precision aerial image from the reticle pattern and evaluating the image performance. Shortening of the line is a serious problem for a line pattern.

In the best-focus state, the line length can be corrected by increasing it by a decrease in line length. However, the line further shortens along with defocusing, so it is desirable that the line length does not change depending on the focus. The line end desirably has high contrast. The contrast of the line end is evaluated based on NILS (Normalized Image Log Slope).

FIG. 11A shows a line width at a position 20 nm inside the line end. FIG. 11B shows the NILS of the end of the center line in the longitudinal direction. Of the types in FIGS. 9A, 9B, and 9C, the type in FIG. 9B exhibits the best balance between the depth of focus and NILS. That is, the image performance can be further improved by limiting, in either or both of the x and y directions, the range where auxiliary patterns with a phase difference of 180° from the target pattern are placed.

It was confirmed that the image performance was improved by placing auxiliary patterns opposite in phase to the target pattern. In addition, the influence of auxiliary patterns with a phase of 180° on the target pattern was checked. The result reveals that there were a range suited to place auxiliary patterns with a phase of 180° and a range where they adversely affect the target pattern when placed there.

Second Embodiment

An application of the first embodiment to an embedded attenuated phase-shift mask (EAPSM) will be described below. The EAPSM corresponds to a mask formed by replacing the light-shielding portion of the reticle in the first embodiment with a film (e.g., molybdenum silicide film) having a low transmittance, generally called a halftone film.

Figure 13:
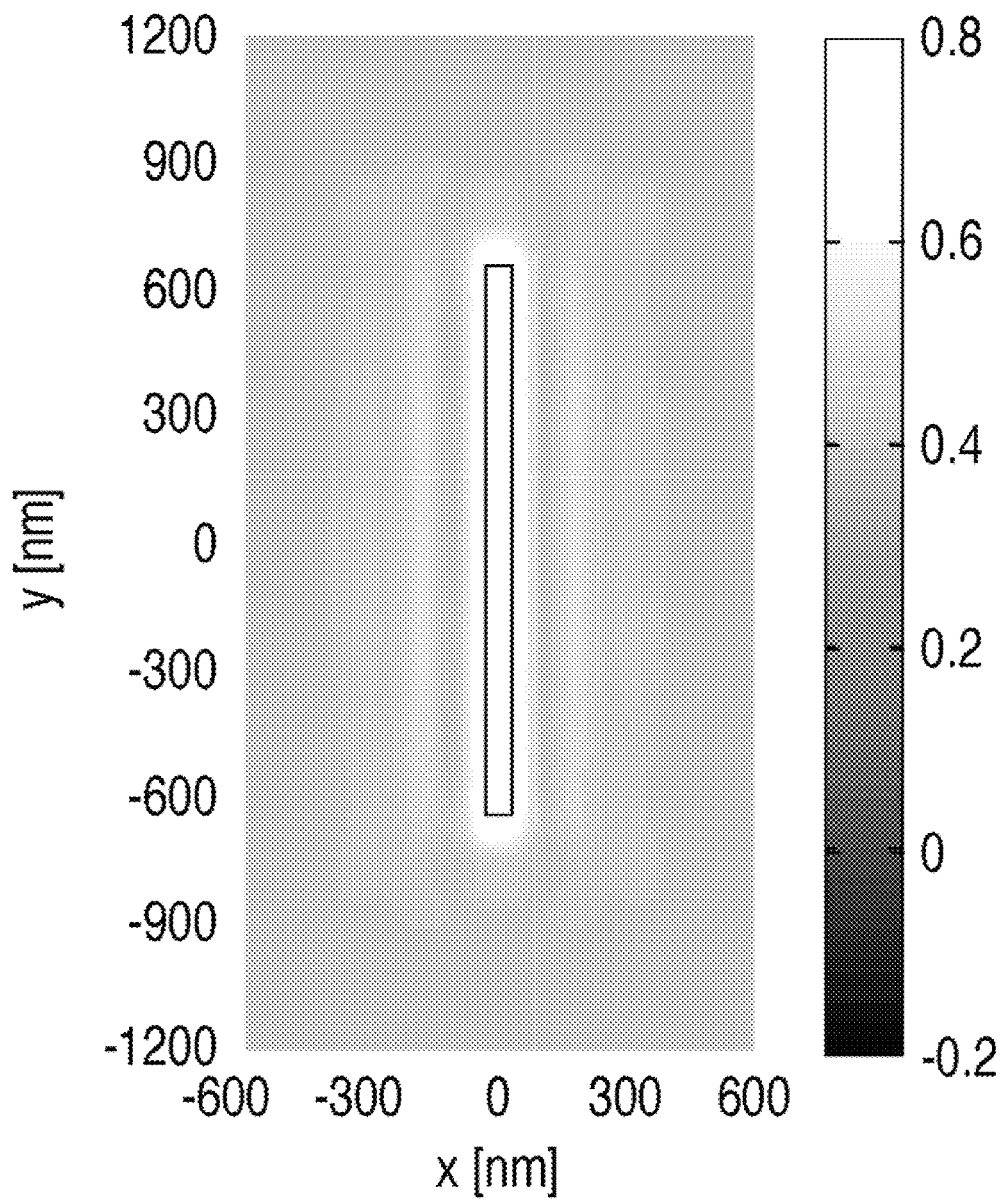
FIG. 13 is a view exemplifying an approximated aerial image.
Figure 14A:
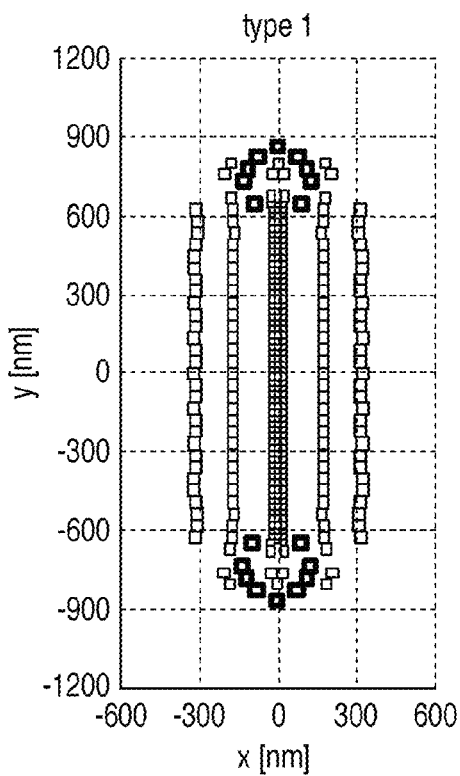
FIGS. 14A and 14B are views exemplifying reticle patterns.
Figure 14B:
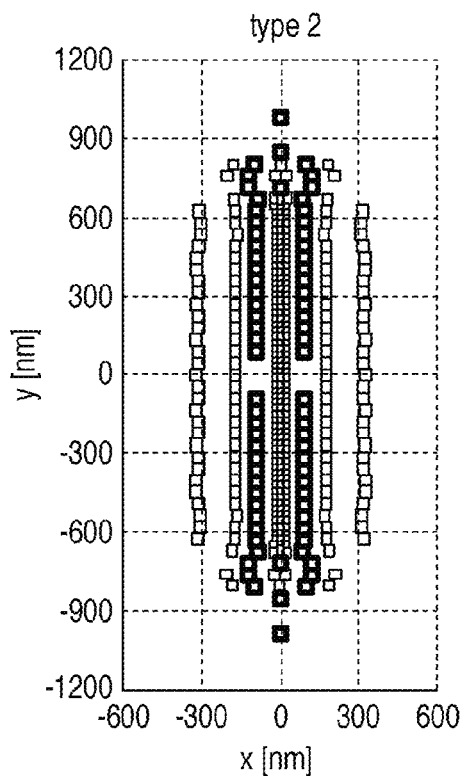

When the same exposure conditions and target pattern as those in the first embodiment are adopted and the background transmittance is set to 6%, an approximated aerial image as shown in FIG. 13 is obtained. FIG. 14B shows a reticle pattern as a result of deforming the target pattern and placing auxiliary patterns each 40 nm on a side, based on the approximated aerial image by the same method as that in the first embodiment. FIG. 14A shows a result of deleting only auxiliary patterns with a phase of 180° that overlap the target pattern translated along the minor axis, similar to the first embodiment.

Figure 15:
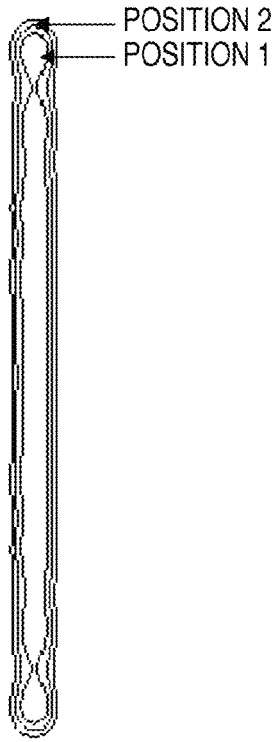
FIG. 15 is a view exemplifying a two-dimensional image obtained by precision calculation.
Figure 16A:
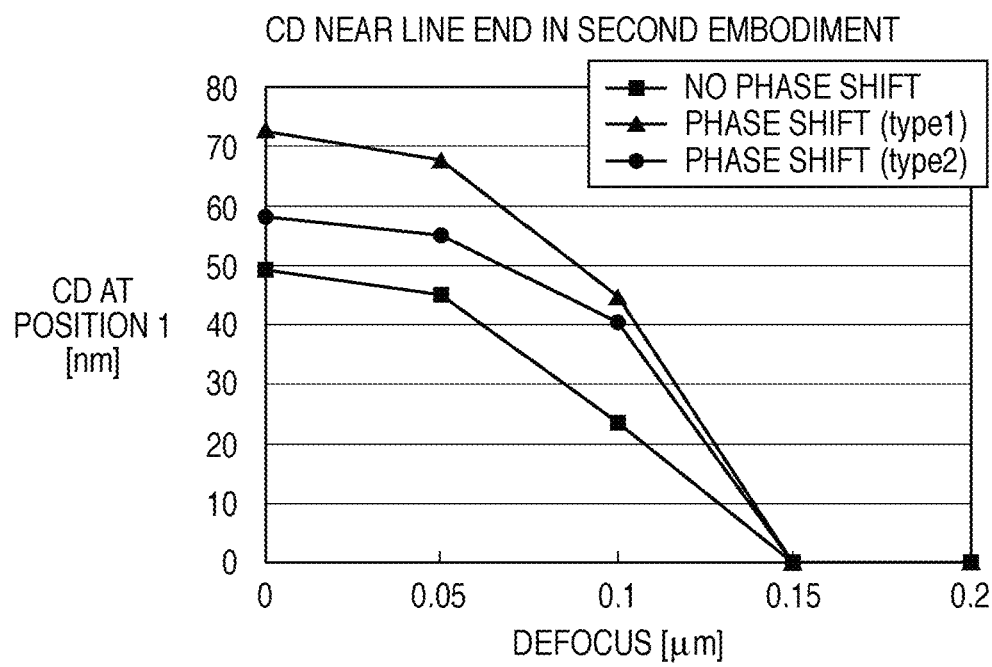
FIGS. 16A and 16B are graphs exemplifying evaluation results.
Figure 16B:
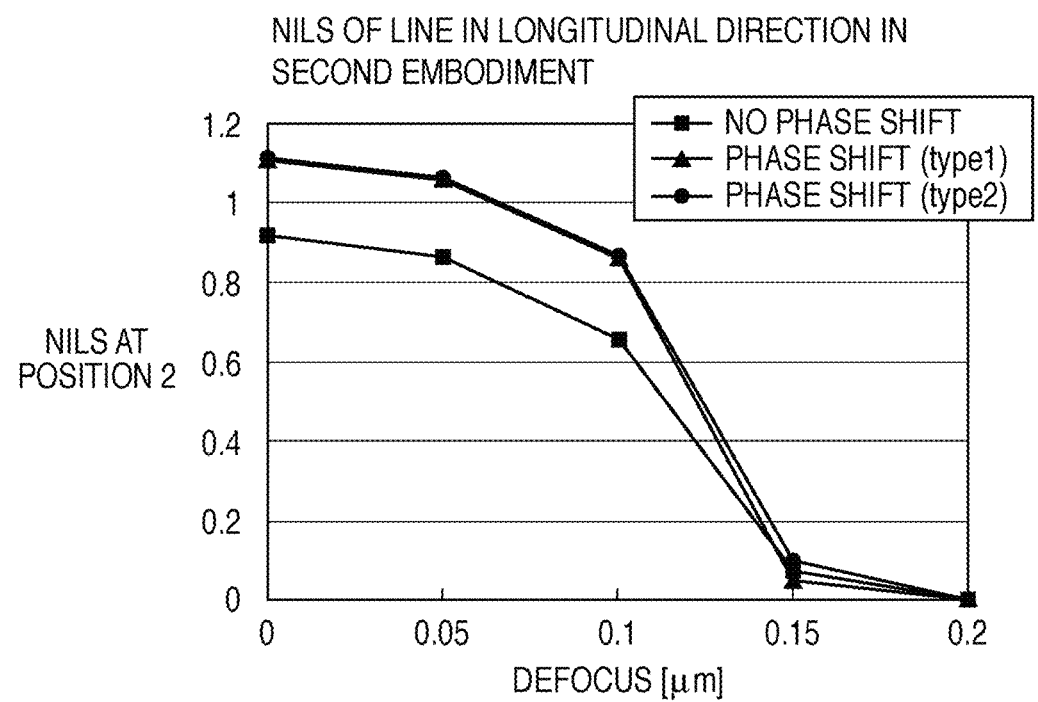

FIG. 15 shows a two-dimensional image obtained by precision calculation from the reticle pattern in FIG. 14B. FIG. 16A shows a line width at a position 20 nm inside the line end. FIG. 16B shows the NILS of the line end in the longitudinal direction. As is apparent from these drawings, auxiliary patterns with a phase of 180° improve the contrast and the depth of focus even in the EAPSM. In addition, excessive correction can be reduced to make the CD more uniform by deleting only auxiliary patterns with a phase of 180° that overlap the target pattern translated along the minor axis.

Third Embodiment

Figure 17:
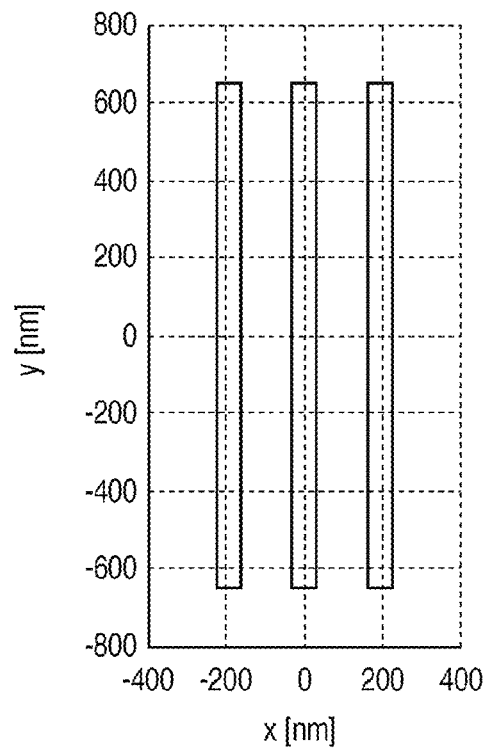
FIG. 17 is a view exemplifying target patterns.
Figure 18A:
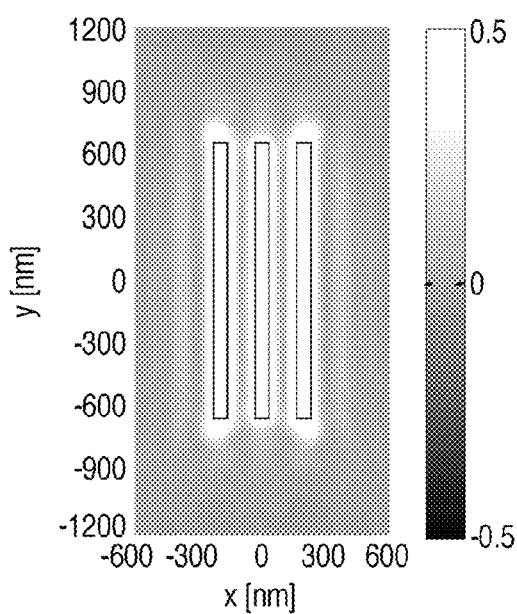
FIGS. 18A and 18B are views exemplifying approximated aerial images.

The same exposure conditions as those in the first embodiment are employed. The target patterns are three light-transmitting line patterns with a line width of 65 nm, a length of 1,300 nm, and an interval of 130 nm along the minor axis, as shown in FIG. 17. Under the conditions described in the first embodiment, an approximated aerial image as shown in FIG. 18A is obtained.

Figure 18B:
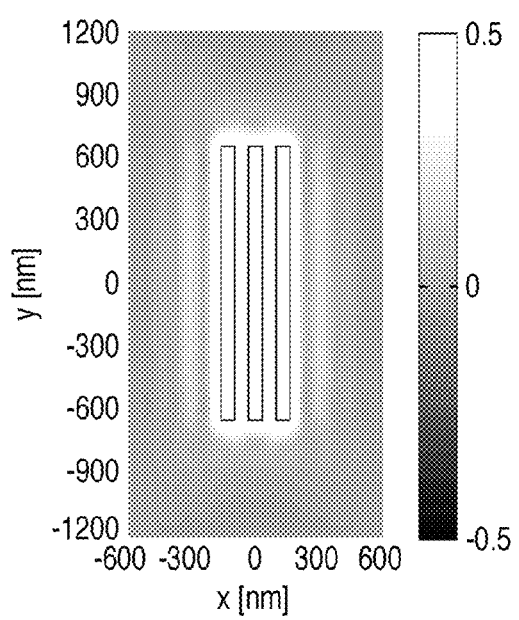

When the interval between lines along the minor axis is changed to 65 nm, an approximated aerial image as shown in FIG. 18B is obtained. As is apparent from FIGS. 18A and 18B, the approximated aerial image changes depending on the pattern density and the auxiliary pattern placement changes, too.

Figure 19A:
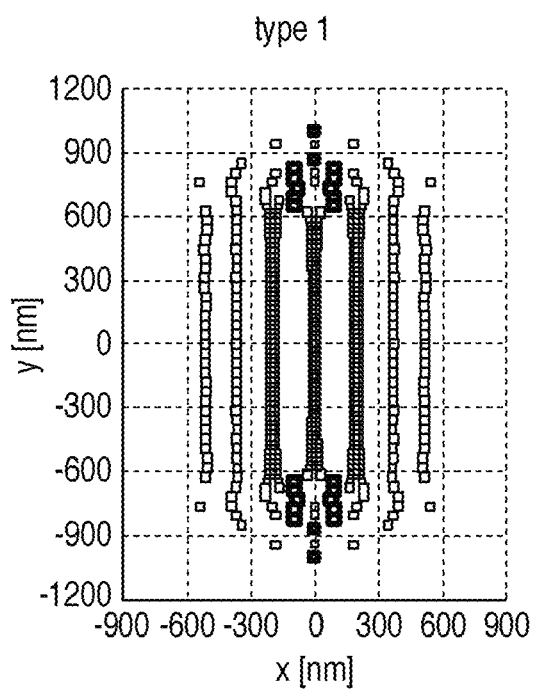
FIGS. 19A and 19B are views exemplifying reticle patterns.
Figure 19B:
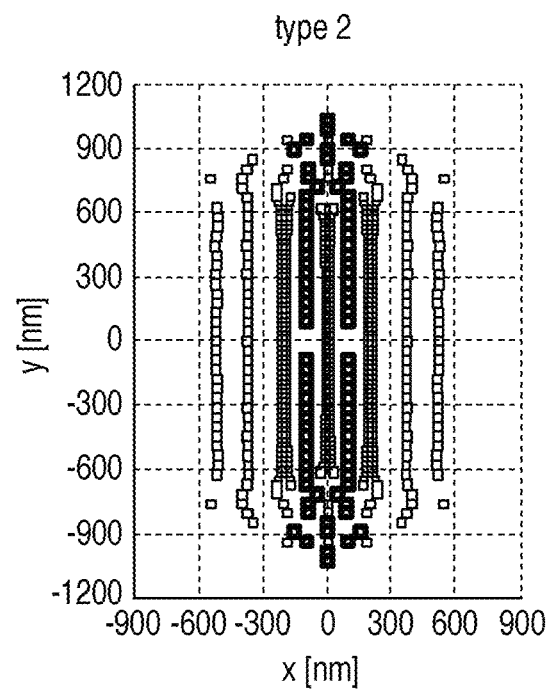

FIG. 19B shows a reticle pattern as a result of deforming the target patterns and placing auxiliary patterns each 40 nm on a side by the same method as that in the first embodiment when the interval is 130 nm. At this time, auxiliary patterns with a phase of 180° are limited to only one of the two sides of the center line. FIG. 19A shows a result of deleting only auxiliary patterns with a phase of 180° that overlap the target patterns translated along the minor axis, similar to the first embodiment.

Figure 20:
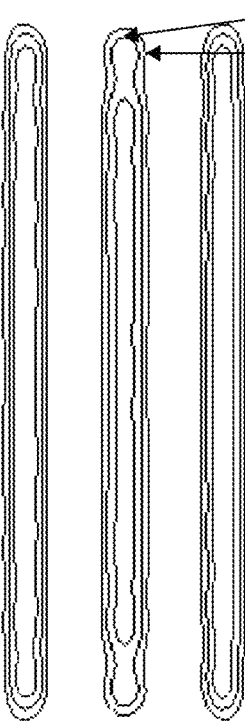
FIG. 20 is a view exemplifying a two-dimensional image obtained by precision calculation.
Figure 21A:
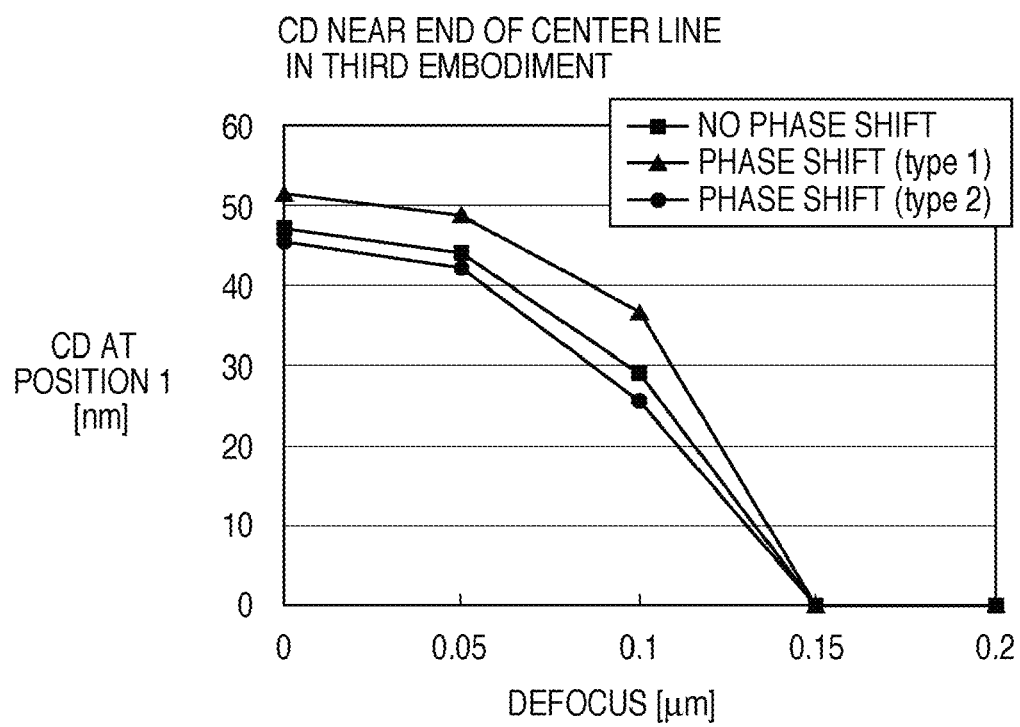
FIGS. 21A and 21B are graphs exemplifying evaluation results.
Figure 21B:
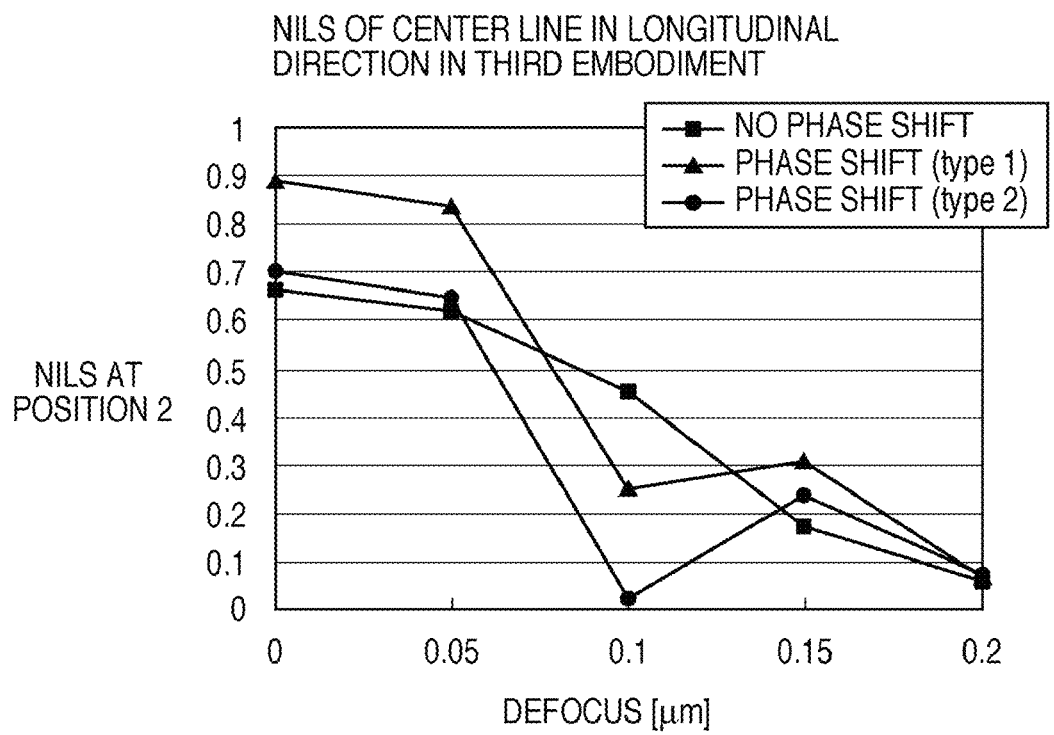

FIG. 20 shows a two-dimensional image obtained by precision calculation from the mask patterns in FIG. 19B. FIG. 21A shows a line width at a position 20 nm inside the end of the center line. FIG. 21B shows the NILS of the end of the center line in the longitudinal direction. Unlike the first embodiment, the characteristics are improved by inserting auxiliary patterns with a phase of 180° between the target patterns.

Fourth Embodiment

Figure 22:
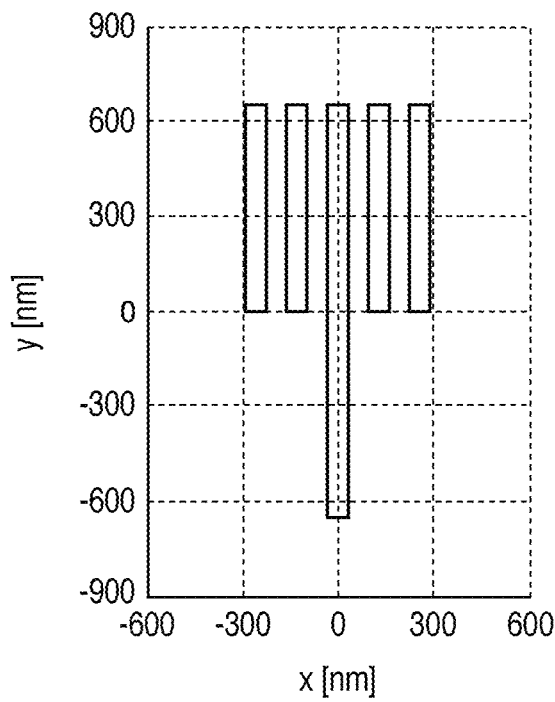
FIG. 22 is a view exemplifying target patterns.
Figure 23:
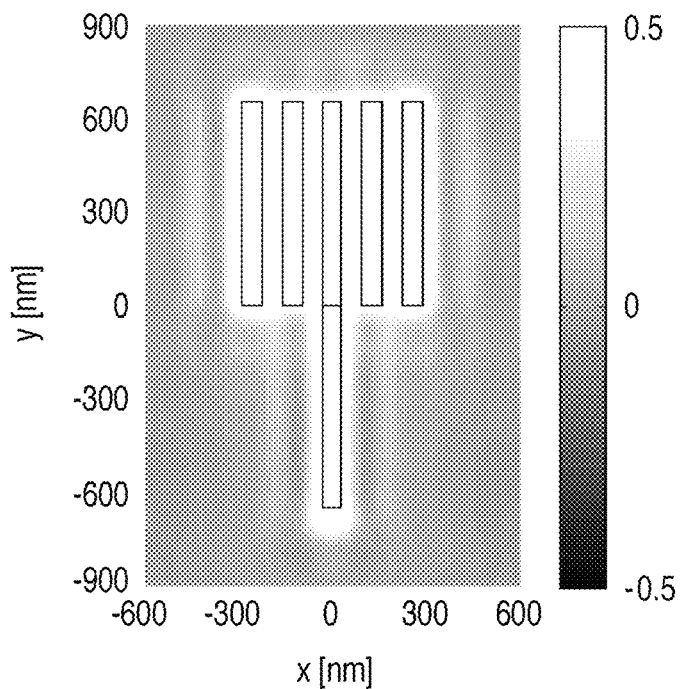
FIG. 23 is a view exemplifying an approximated aerial image.
Figure 24A:
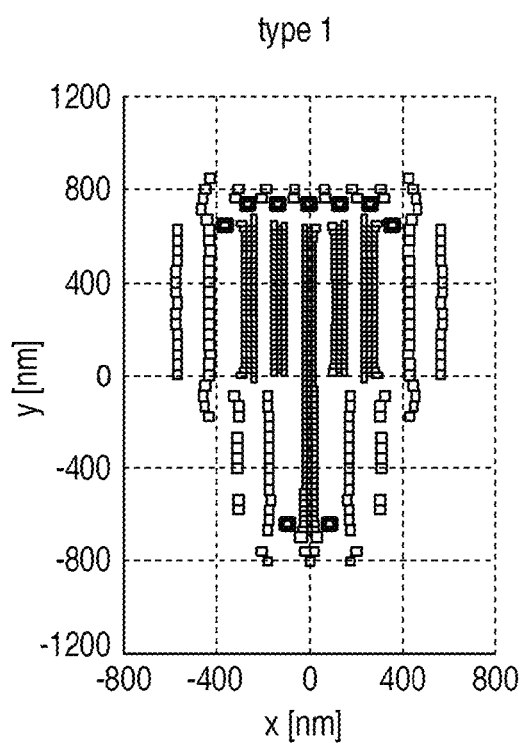
FIGS. 24A and 24B are views exemplifying reticle patterns.
Figure 24B:
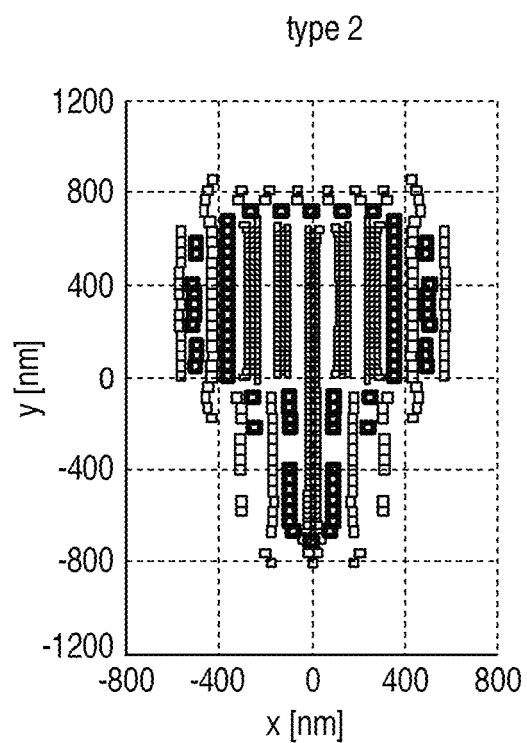

The same exposure conditions as those in the first embodiment are adopted. The target patterns are five light-transmitting line patterns with a line width of 65 nm, a length of 1,300 nm for the center line and 650 nm for the remaining lines, and an interval of 65 nm along the minor axis, as shown in FIG. 22. All the five lines are placed in line at one line end. Under the conditions described in the first embodiment, an approximated aerial image as shown in FIG. 23 is obtained from the target patterns, similar to the first embodiment. FIG. 24B shows a reticle pattern as a result of deforming the target patterns and placing auxiliary patterns each 40 nm on a side by the same method as that in the first embodiment. FIG. 24A shows a result of deleting only auxiliary patterns with a phase of 180° that overlap the target patterns translated along the minor axis, similar to the first embodiment.

Figure 25:
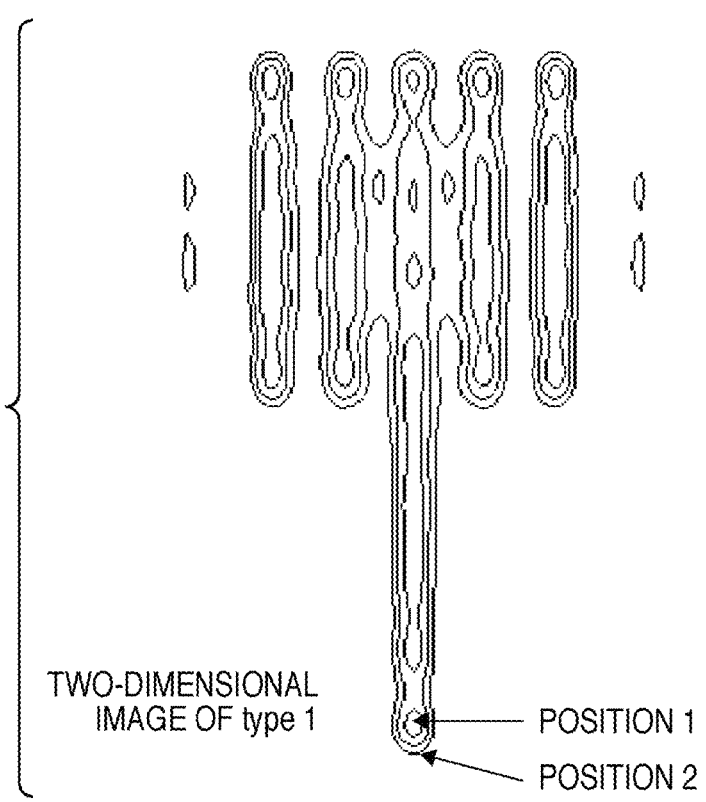
FIG. 25 is a view exemplifying a two-dimensional image obtained by precision calculation.
Figure 26A:
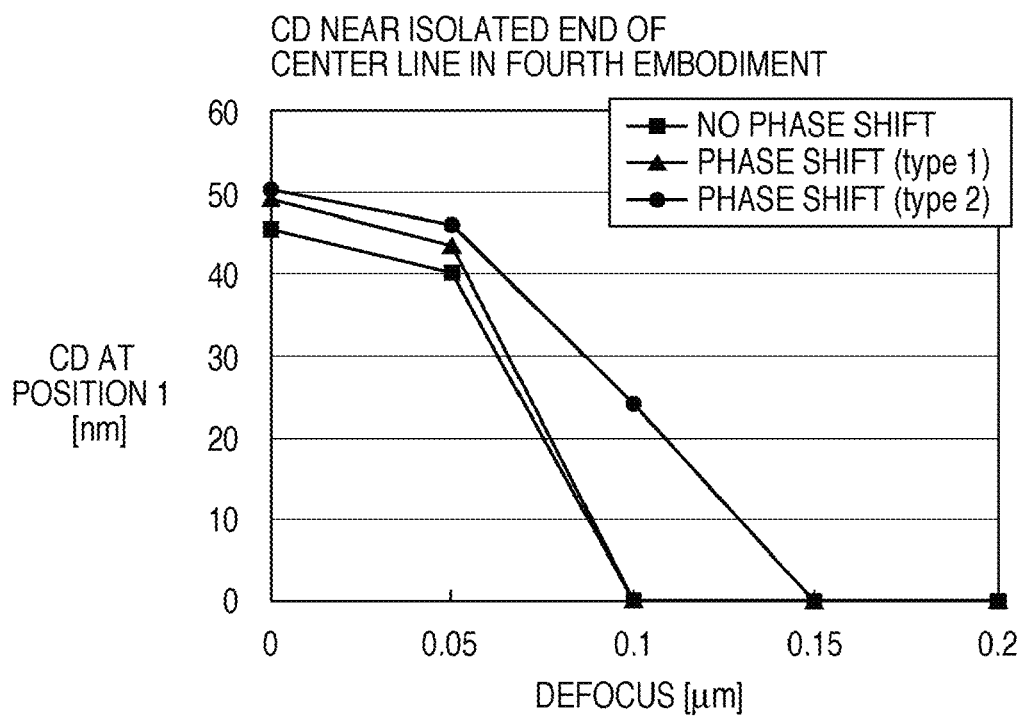
FIGS. 26A and 26B are graphs exemplifying evaluation results.
Figure 26B:
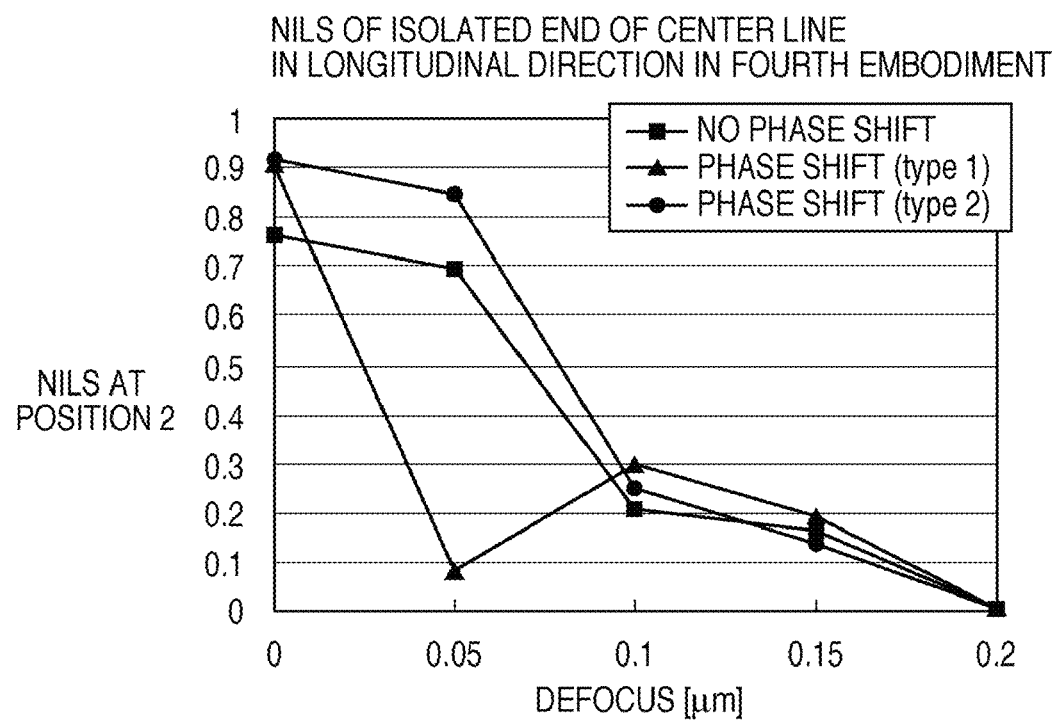

FIG. 25 shows a two-dimensional image obtained by precision calculation from the reticle patterns. FIG. 26A shows a line width at a position 20 nm inside the isolated end (lower end in FIG. 25) of the center line. FIG. 26B shows the NILS of the isolated end of the center line in the longitudinal direction. By deleting only auxiliary patterns with a phase of 180° that overlap the target patterns along the minor axis, the contrast and the depth of focus are improved and a decrease in the line width of the line end is reduced.

Fifth Embodiment

Figure 27:
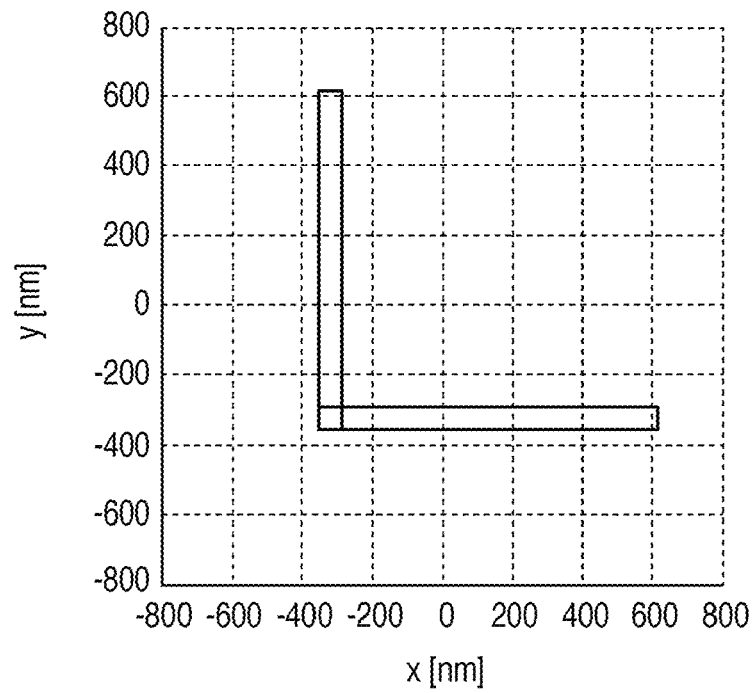
FIG. 27 is a view exemplifying a target pattern.
Figure 28:
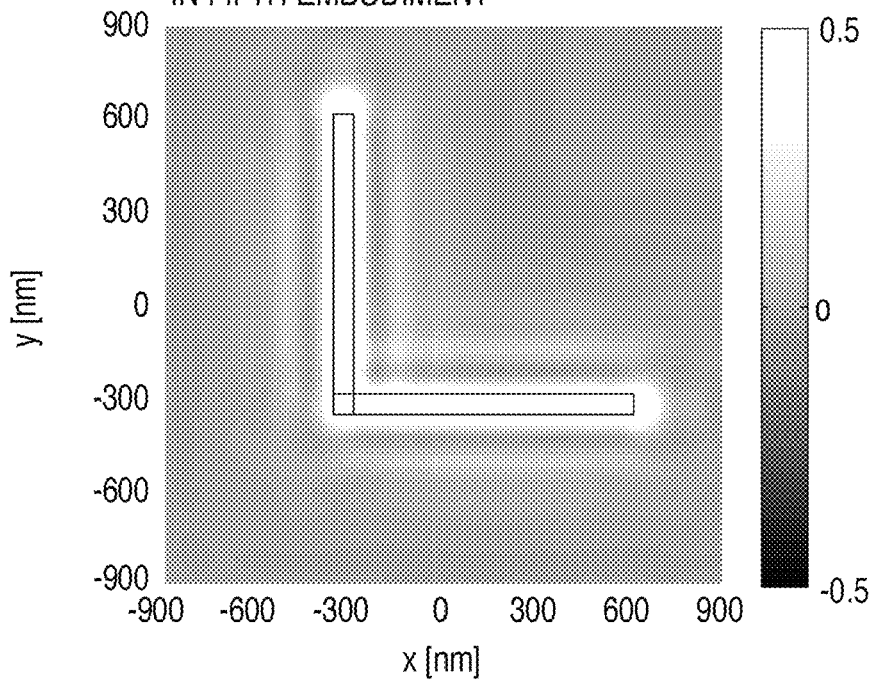
FIG. 28 is a view exemplifying an approximated aerial image.

The same exposure conditions as those in the first embodiment are employed. The target pattern is an L-shaped pattern formed by connecting two light-transmitting lines with a line width of 65 nm and a length of 1,300 nm, as shown in FIG. 27. Under the conditions described in the first embodiment, an approximated aerial image as shown in FIG. 28 is obtained from the target pattern, similar to the first embodiment. FIG. 29B shows a reticle pattern as a result of deforming the target pattern and placing auxiliary patterns each 40 nm on a side by the same method as that in the first embodiment. FIG. 29A shows a result of deleting only auxiliary patterns with a phase of 180° that overlap the target pattern translated along the minor axis, similar to the first embodiment.

Figure 31A:
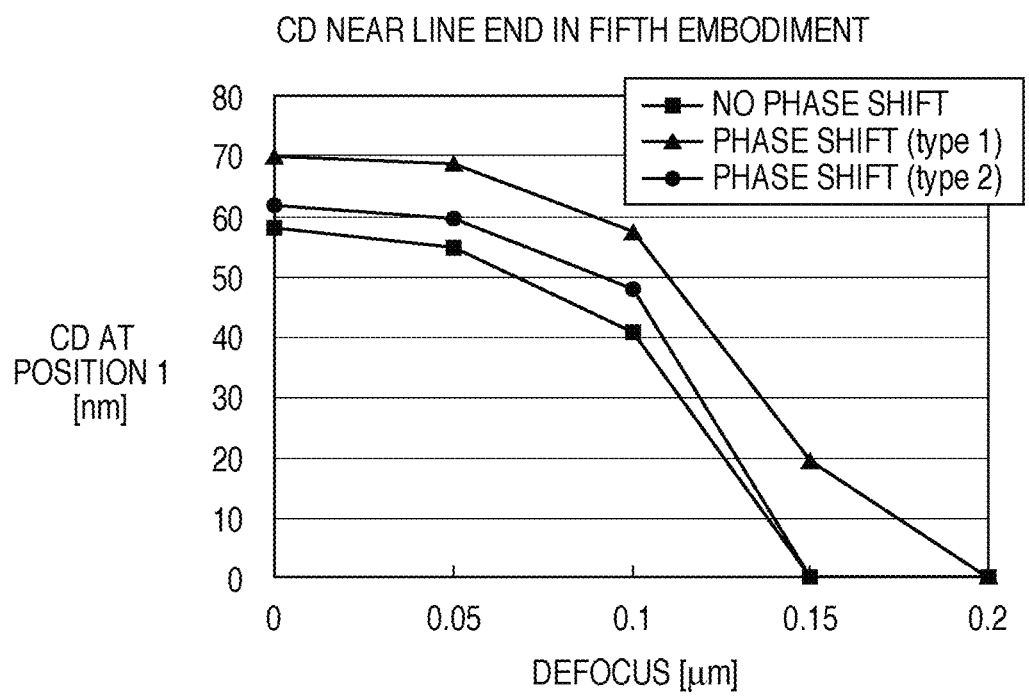
FIGS. 31A and 31B are graphs exemplifying evaluation results.
Figure 31B:
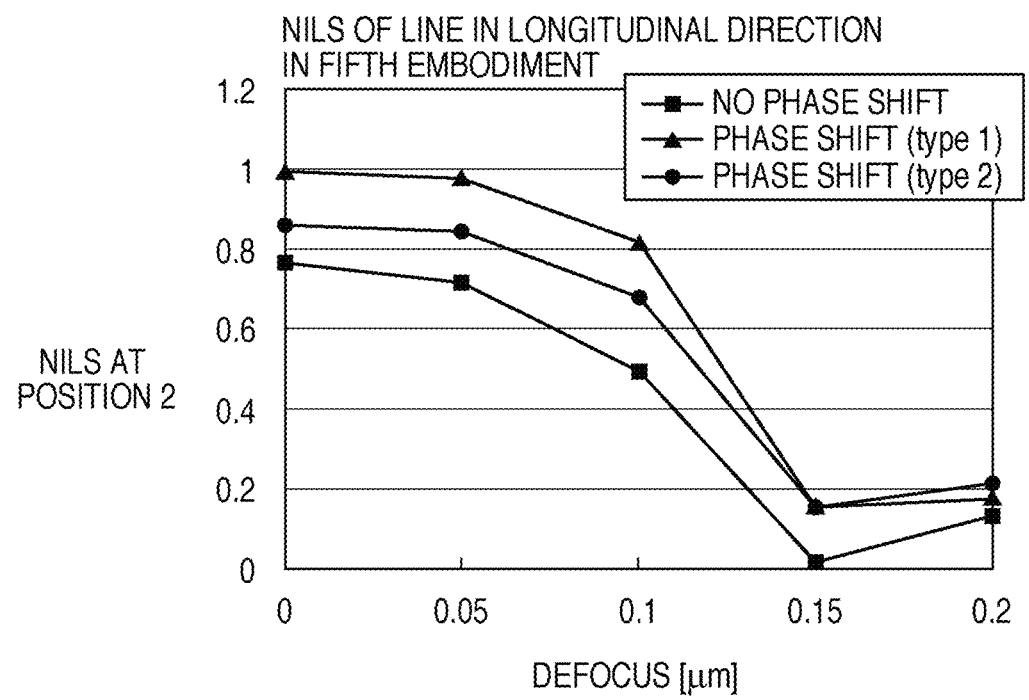

FIG. 30 shows a two-dimensional image obtained by precision calculation from the reticle pattern. FIG. 31A shows a line width at a position 20 nm inside the line end. FIG. 31B shows the NILS of the line end in the longitudinal direction. As is apparent from these drawings, the characteristics are improved when an auxiliary pattern with a phase of 180° is not deleted.

Sixth Embodiment

Figure 32A:
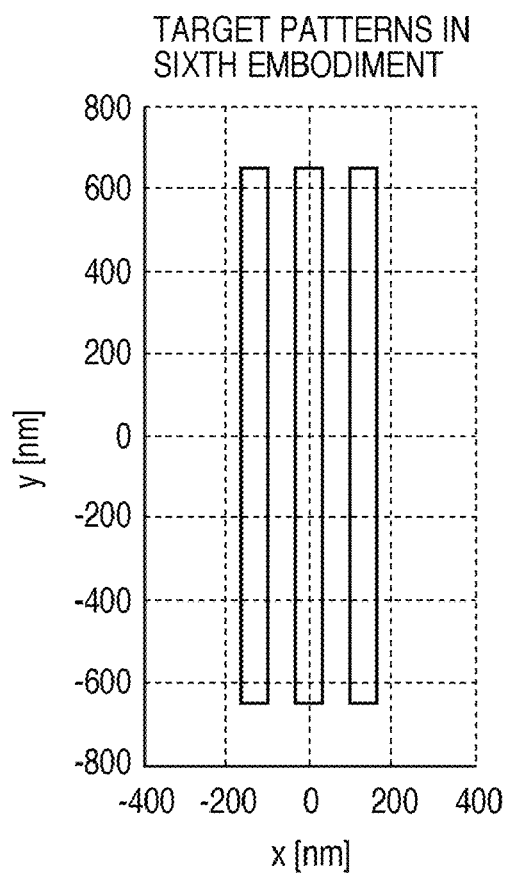
FIGS. 32A and 32B are views exemplifying target patterns.
Figure 32B:
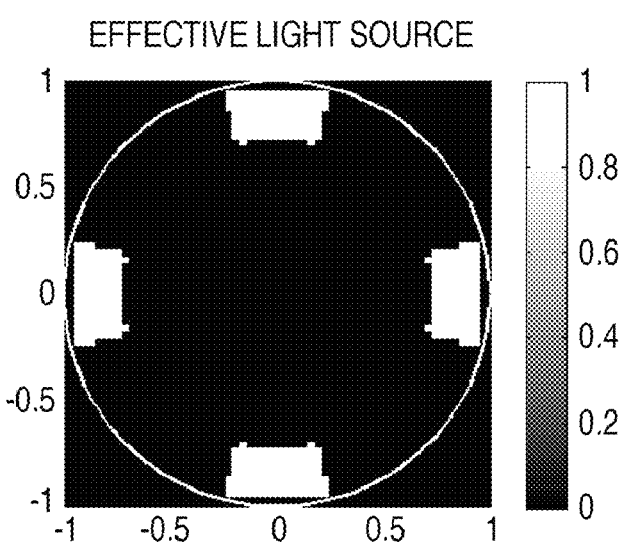
Figure 33:
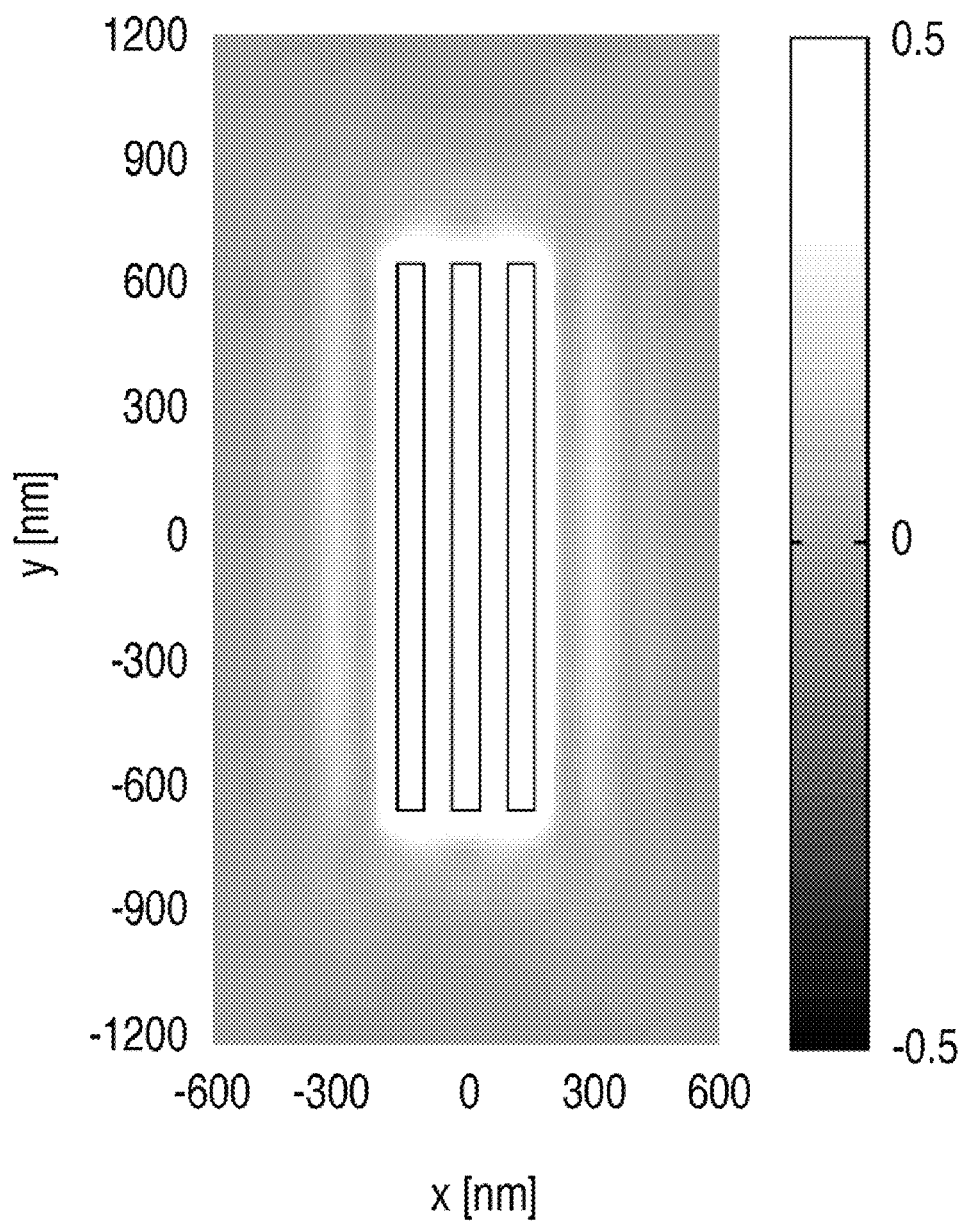
FIG. 33 is a view exemplifying an approximated aerial image.
Figure 34A:
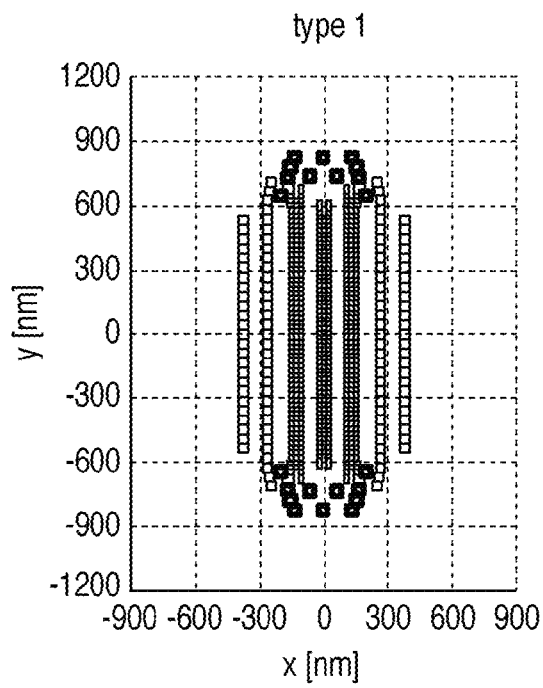
FIGS. 34A and 34B are views exemplifying reticle patterns.
Figure 34B:
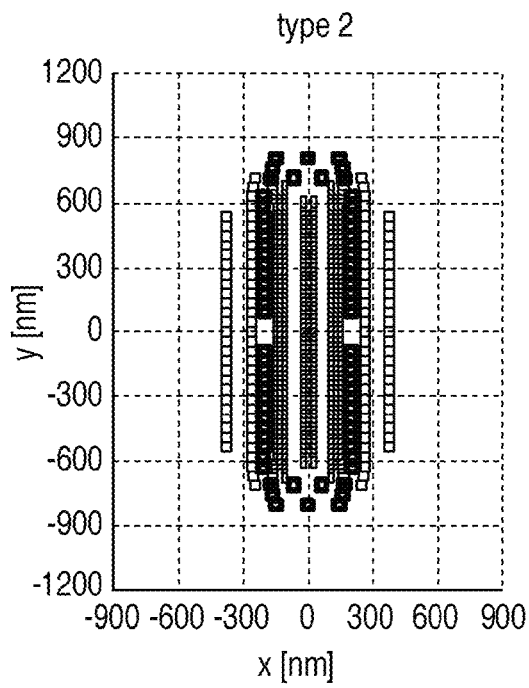

The same exposure conditions as those in the first embodiment are adopted. The target patterns are three light-transmitting lines with a line width of 65 nm, a length of 1,300 nm, and an interval of 65 nm along the minor axis, as shown in FIG. 32A. The effective light source is a cross-pole illumination as shown in FIG. 32B. Under these conditions, an approximated aerial image as shown in FIG. 33 is obtained from the target patterns, similar to the first embodiment. FIG. 34B shows a reticle pattern as a result of deforming the target patterns and placing auxiliary patterns each 40 nm on a side by the same method as that in the first embodiment. FIG. 34A shows a result of deleting only auxiliary patterns with a phase of 180° that overlap the target patterns translated along the minor axis, similar to the first embodiment.

Figure 35:
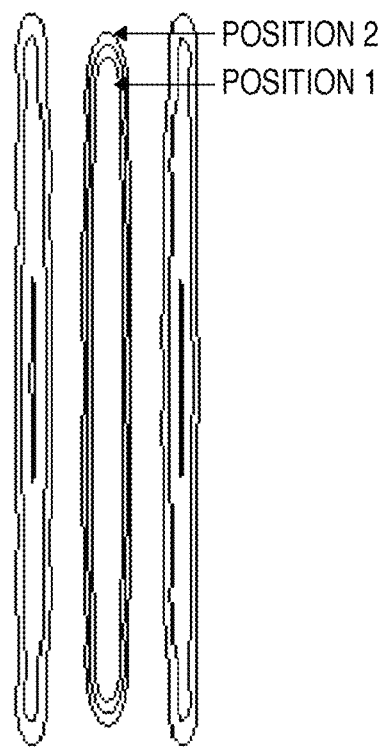
FIG. 35 is a view exemplifying a two-dimensional image obtained by precision calculation.
Figure 36A:
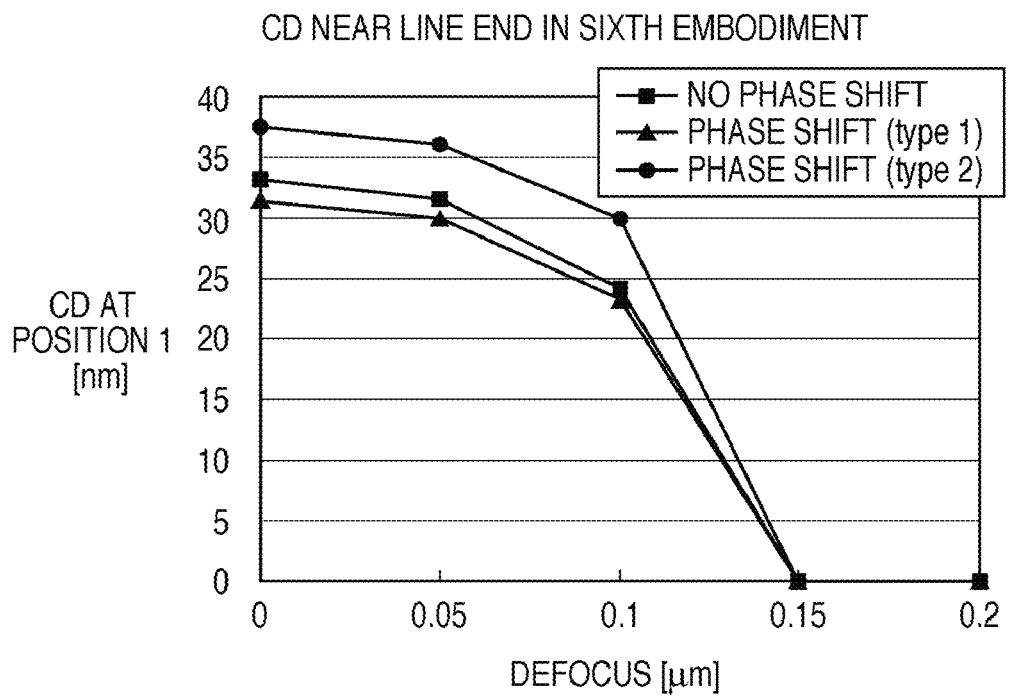
FIGS. 36A and 36B are graphs exemplifying evaluation results.
Figure 36B:
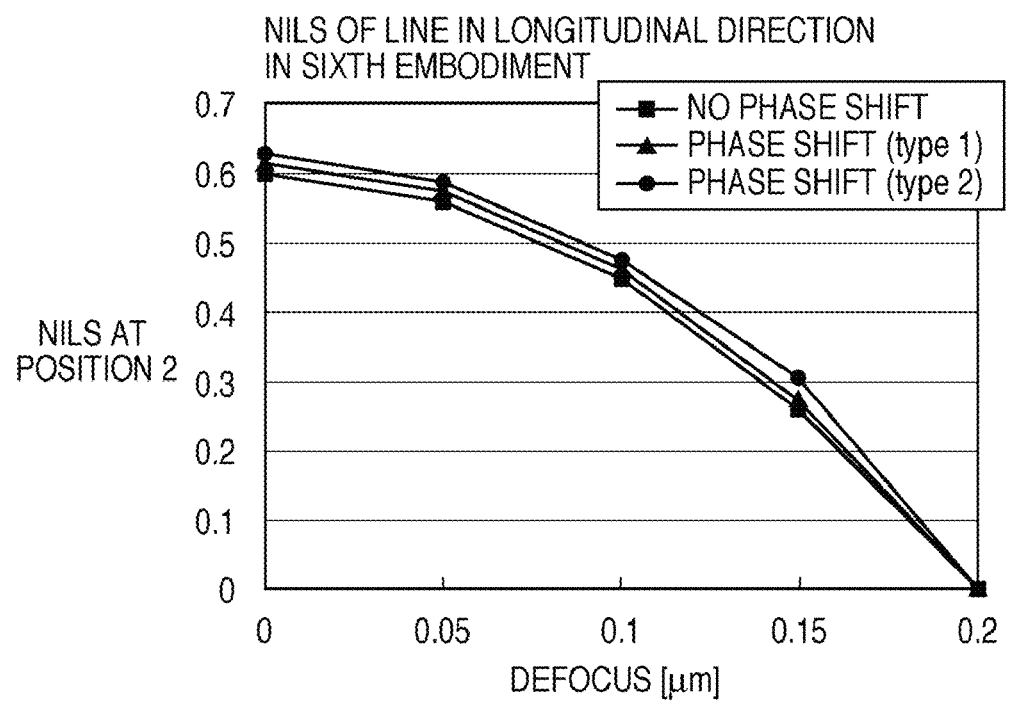

FIG. 35 shows a two-dimensional image obtained by precision calculation from the reticle patterns in FIG. 34A. FIG. 36A shows a line width at a position 20 nm inside the line end. FIG. 36B shows the NILS of the line end in the longitudinal direction. As is apparent from these drawings, the characteristics are improved when an auxiliary pattern with a phase of 180° is not deleted.

Figure 12:
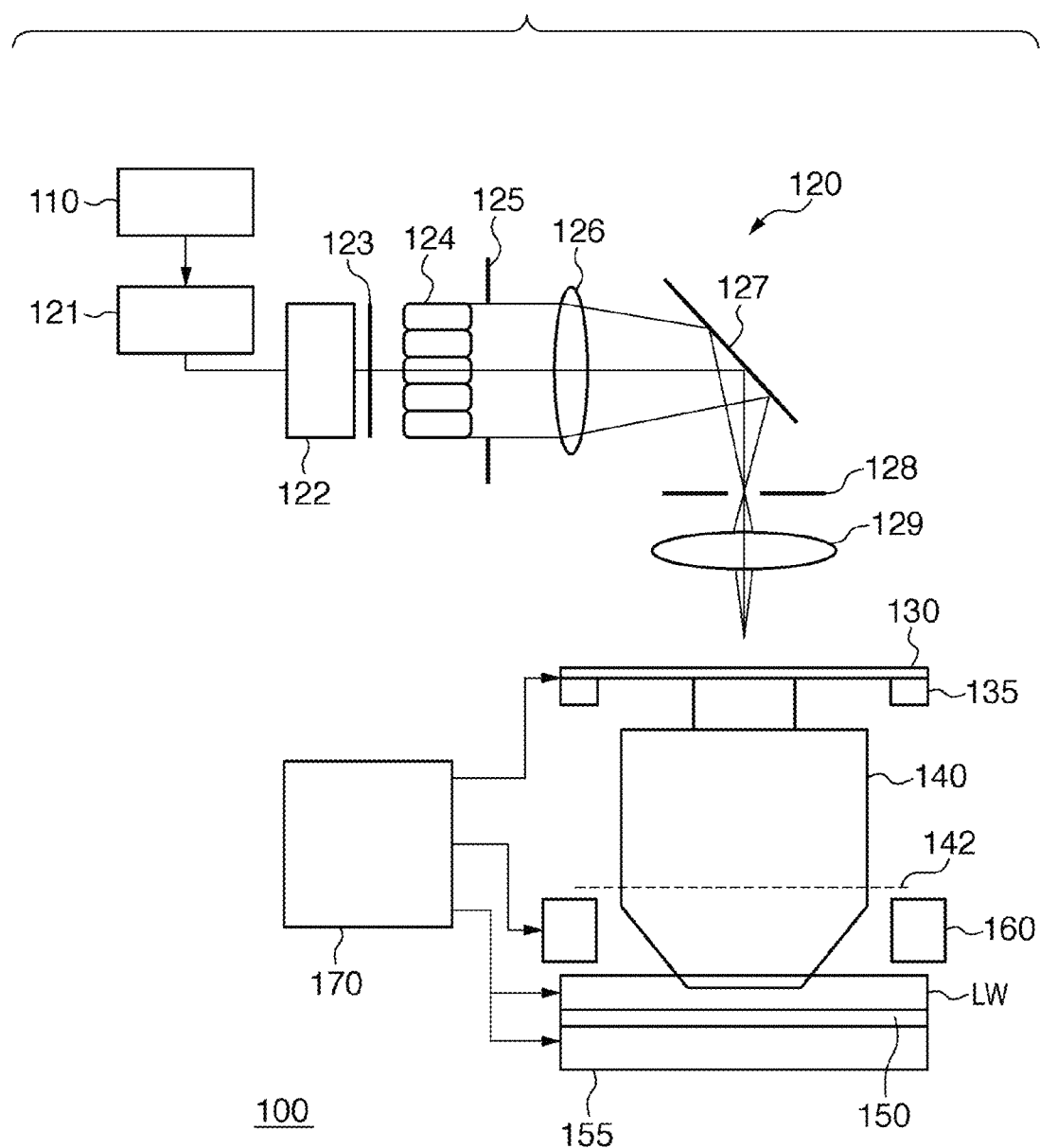
FIG. 12 is a view exemplifying the arrangement of an exposure apparatus.

An exposure apparatus 100 will be explained next with reference to FIG. 12. FIG. 12 is a block diagram showing the schematic arrangement of the exposure apparatus 100. A reticle 130 is one produced based on reticle data generated by executing the above-described reticle data generating program.

The exposure apparatus 100 is an immersion exposure apparatus. A liquid LW is supplied between a projection optical system 140 and a substrate 150. The pattern of the reticle 130 is projected onto the substrate 150 via the projection optical system 140 and liquid LW, thereby exposing the substrate 150. In this example, the exposure apparatus 100 is of the step & scan type, but can be of the step & repeat type or another type.

As shown in FIG. 12, the exposure apparatus 100 includes a light source 110, an illumination optical system 120, a reticle stage 135 which holds the reticle 130, the projection optical system 140, a substrate stage 155 which holds the substrate 150, a liquid supply/recovery unit 160, and a main control system 170. The light source 110 and illumination optical system 120 constitute an illumination device which illuminates the reticle 130.

The light source 110 is an excimer laser such as a KrF excimer laser having a wavelength of about 248 nm or an ArF excimer laser having a wavelength of about 193 nm. However, the type and number of light sources 110 are not particularly limited. For example, an $F_2$ laser having a wavelength of about 157 nm is usable as the light source 110.

The illumination optical system 120 illuminates the reticle 130 with light emitted by the light source 110. The illumination optical system 120 is configured to be able to illuminate the reticle 130 in various illumination modes (illumination conditions) such as a modified illumination (e.g., quadrupole illumination). The illumination optical system 120 includes, for example, a beam shaping optical system 121, condensing optical system 122, polarization control unit 123, optical integrator 124, and aperture stop 125. The illumination optical system 120 further includes a condenser lens 126, deflection mirror 127, masking blade 128, and imaging lens 129.

The beam shaping optical system 121 may include, for example, a beam expander formed from a plurality of cylindrical lenses. The beam shaping optical system 121 converts the aspect ratio of the sectional shape of collimated light from the light source 110 into a predetermined value (e.g., converts the sectional shape from a rectangle to a square). The beam shaping optical system 121 shapes light emitted by the light source 110 into light having a size and an angle of divergence necessary to illuminate the optical integrator 124.

The condensing optical system 122 includes a plurality of optical elements, and efficiently guides light shaped by the beam shaping optical system 121 to the optical integrator 124. The condensing optical system 122 includes, for example, a zoom lens system, and adjusts the shape and angle of light which enters the optical integrator 124.

The polarization control unit 123 includes, for example, a polarizing element and is arranged at a position nearly conjugate to a pupil plane 142 of the projection optical system 140. The polarization control unit 123 controls the polarization state of a predetermined region of an effective light source formed on the pupil plane 142 of the projection optical system 140.

The optical integrator 124 has a function of uniforming illumination light which illuminates the reticle 130, converting the angular distribution of incident light into a positional distribution, and outputting the resultant light. The optical integrator 124 is, e.g., a fly-eye lens whose incident surface and exit surface hold a Fourier transform relationship. The fly-eye lens is formed by combining a plurality of rod lenses (i.e., microlens elements). However, the optical integrator 124 is not limited to the fly-eye lens and may be, e.g., optical rods, diffraction gratings, or a pair of cylindrical lens array plates arranged perpendicular to each other.

The aperture stop 125 is located at a position which is immediately after the exit surface of the optical integrator 124 and is nearly conjugate to the effective light source formed on the pupil plane 142 of the projection optical system 140. The aperture shape of the aperture stop 125 corresponds to the light intensity distribution (i.e., effective light source shape) of the effective light source formed on the pupil plane 142 of the projection optical system 140. In other words, the aperture stop 125 controls the light intensity distribution of the effective light source. The aperture stop 125 is switchable depending on the illumination mode. With or without the aperture stop, the shape of the effective light source may be adjusted by arranging a diffractive optical element (CGH) or prism on the side of the light source with respect to the optical integrator 124.

The condenser lens 126 converges light which has emerged from a secondary light source formed near the exit surface of the optical integrator 124 and passed through the aperture stop 125. The converged light uniformly illuminates the masking blade 128 via the deflection mirror 127.

The masking blade 128 is arranged at a position nearly conjugate to the reticle 130 and includes a plurality of movable light-shielding plates. The masking blade 128 forms an almost rectangular opening corresponding to the effective area of the projection optical system 140. The light having passed through the masking blade 128 is used as illumination light which illuminates the reticle 130. The imaging lens 129 forms, on the reticle 130, an image of the light having passed through the opening of the masking blade 128.

The reticle 130 is produced based on reticle data generated by an information processing apparatus 1 described above, and has a circuit pattern (main pattern) to be transferred on a substrate and an auxiliary pattern. The reticle stage 135 supports and drives the reticle 130. Light diffracted by the reticle 130 impinges on the substrate 150 via the projection optical system 140 and liquid LW. The reticle 130 and substrate 150 are arranged to have an optically conjugate relationship. The exposure apparatus 100 transfers the circuit pattern of the reticle 130 onto the substrate 150 by synchronously scanning them. When the exposure apparatus 100 is of the step & repeat type, it exposes the substrate 150 while the reticle 130 and substrate 150 stay still.

The reticle stage 135 supports the reticle 130 via a reticle chuck and is connected to a driving mechanism (not shown). The driving mechanism (not shown) is formed from a linear motor or the like, and drives the reticle stage 135 in the X-, Y-, and Z-axis directions and the rotational directions about the respective axes. Note that the scanning direction on the reticle 130 or substrate 150 is defined as the Y-axis direction, a direction perpendicular to it is defined as the X-axis direction, and a direction perpendicular to the surface of the reticle 130 or substrate 150 is defined as the Z-axis direction.

The projection optical system 140 projects the circuit pattern of the reticle 130 onto the substrate 150. The projection optical system 140 can be a dioptric system, catadioptric system, or catoptric system. The final optical element (final surface) of the projection optical system 140 is coated (for protection) to reduce the influence of the liquid LW supplied from the liquid supply/recovery unit 160.

The circuit pattern of the reticle 130 is projected (transferred) on the substrate 150. However, the substrate 150 can be replaced with a glass plate or another substrate. The substrate 150 is coated with a resist.

The substrate stage 155 supports the substrate 150 and moves it in the X-, Y-, and Z-axis directions and the rotational directions about the respective axes using a linear motor, like the reticle stage 135.

The liquid supply/recovery unit 160 has a function of supplying the liquid LW to the space between the final optical element (final surface) of the projection optical system 140 and the substrate 150. The liquid supply/recovery unit 160 also has a function of recovering the liquid LW supplied to the space between the final optical element of the projection optical system 140 and the substrate 150. As the liquid LW, a substance is selected, which has a high transmittance for exposure light, prevents adhesion of dirt on (the final lens of) the projection optical system 140, and matches the resist process well.

The main control system 170 has a CPU and memory and controls the operation of the exposure apparatus 100. For example, the main control system 170 is electrically connected to the reticle stage 135, substrate stage 155, and liquid supply/recovery unit 160. The main control system 170 controls synchronous scanning of the reticle stage 135 and substrate stage 155. Based on the scanning direction and speed of the substrate stage 155 and the like in exposure, the main control system 170 controls switching between supply, recovery, and stop of the liquid LW. The main control system 170 performs illumination control especially based on information input from a monitor and input device and that from the illumination device. For example, the main control system 170 drives and controls the aperture stop 125 via a driving mechanism. The monitor and the monitor of the input device display control information of the main control system 170 and other kinds of information. The main control system 170 receives information on an effective light source in each embodiment described above, and forms the effective light source by controlling the aperture stop, diffractive optical element, prism, and the like.

In exposure, a light beam emitted by the light source 110 illuminates the reticle 130 via the illumination optical system 120. After passing through the reticle 130, the light beam which reflects the circuit pattern forms an image on the substrate 150 via the projection optical system 140 and liquid LW. The exposure apparatus 100 has excellent imaging performance and can provide devices (e.g., a semiconductor element, an LCD element, an image sensing element (e.g., a CCD), and a thin-film magnetic head) with high throughput and good economical efficiency.

A device manufacturing method according to the embodiment of the present invention is available for manufacturing a device such as a semiconductor device or liquid crystal device. This method can include a step of exposing a substrate coated with a photoresist using the exposure apparatus, and a step of developing the exposed substrate. The device manufacturing method can further include other well-known steps (e.g., oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-009361, filed Jan. 19, 2009, and No. 2009-290867, filed Dec. 22, 2009, which are hereby incorporated by reference herein in their entirety.

What is claimed is:

1. A method of generating reticle data for producing a reticle used in an exposure apparatus in which a projection optical system projects a pattern of the reticle onto a substrate, the pattern of the reticle including a main pattern, a first auxiliary pattern, and a second auxiliary pattern, the first auxiliary pattern and the second auxiliary pattern being patterns not to resolve, light having passed through the first auxiliary pattern and light having passed through the main pattern being in phase, and light having passed through the second auxiliary pattern and light having passed through the main pattern having a phase difference of 180° from each other, the method comprising the steps of:
   determining the main pattern based on an aerial image formed on an image plane of the projection optical system when a target pattern is placed on an object plane of the projection optical system;
   determining the first auxiliary pattern and the second auxiliary pattern based on the aerial image formed on the image plane when either of the target pattern and the main pattern is placed on the object plane; and
   when the first auxiliary pattern and the second auxiliary pattern overlap each other, deleting either of the first auxiliary pattern and the second auxiliary pattern or deforming at least either of the first auxiliary pattern and the second auxiliary pattern.

2. The method according to claim 1, wherein when the first auxiliary pattern and the second auxiliary pattern overlap each other, the second auxiliary pattern is deleted.

3. The method according to claim 1, wherein the first auxiliary pattern and the second auxiliary pattern are placed according to a placement rule that a region in which the first auxiliary pattern can be placed contains a region in which the second auxiliary pattern can be placed.

4. The method according to claim 1, wherein when the main pattern includes a rectangular pattern having a long side and a short side, the second auxiliary pattern is not placed in a rectangular forbidden region crossing the long side.

5. The method according to claim 4, wherein the forbidden region is determined in accordance with a density of the target pattern.

6. The method according to claim 4, wherein the forbidden region is determined in accordance with an illumination condition to illuminate the reticle.

7. The method according to claim 1, wherein the aerial image takes one of a positive value and a negative value, and
wherein the first auxiliary pattern is placed at a position within a region in which a value of the aerial image exceeds a first threshold, and the second auxiliary pattern is placed at a position within a region in which a value of the aerial image does not exceed a second threshold whose sign is same with that of the first threshold.

8. A method of producing a reticle, comprising the steps of:
generating reticle data; and
producing a reticle in accordance with the reticle data,
wherein a pattern of the reticle includes a main pattern, a first auxiliary pattern, and a second auxiliary pattern, the first auxiliary pattern and the second auxiliary pattern being patterns not to resolve, light having passed through the first auxiliary pattern and light having passed through the main pattern being in phase, and light having passed through the second auxiliary pattern and light having passed through the main pattern having a phase difference of 180° from each other, and
the step of generating reticle data includes:
determining the main pattern based on an aerial image formed on an image plane of the projection optical system when a target pattern is placed on an object plane of the projection optical system;
determining the first auxiliary pattern and the second auxiliary pattern based on the aerial image formed on the image plane when either of the target pattern and the main pattern is placed on the object plane; and
when the first auxiliary pattern and the second auxiliary pattern overlap each other, deleting either of the first auxiliary pattern and the second auxiliary pattern or deforming at least either of the first auxiliary pattern and the second auxiliary pattern.

9. A non-transitory computer-readable memory medium storing a program for causing a computer to generate reticle data for producing a reticle used in an exposure apparatus in which a projection optical system projects a pattern of the reticle onto a substrate, the pattern of the reticle including a main pattern, a first auxiliary pattern, and a second auxiliary pattern, the first auxiliary pattern and the second auxiliary pattern being patterns not to resolve, light having passed through the first auxiliary pattern and light having passed through the main pattern being in phase, and light having passed through the second auxiliary pattern and light having passed through the main pattern having a phase difference of 180° from each other, the program causing the computer to execute processing including the steps of:
determining the main pattern based on an aerial image formed on an image plane of the projection optical system when a target pattern is placed on an object plane of the projection optical system;
determining the first auxiliary pattern and the second auxiliary pattern based on the aerial image formed on the image plane when either of the target pattern and the main pattern is placed on the object plane; and
when the first auxiliary pattern and the second auxiliary pattern overlap each other, deleting either of the first auxiliary pattern and the second auxiliary pattern or deforming at least either of the first auxiliary pattern and the second auxiliary pattern.

* * * * *